United States Patent
Kanbayashi et al.

(10) Patent No.: US 7,142,003 B2
(45) Date of Patent: Nov. 28, 2006

(54) TEST APPARATUS

(75) Inventors: Hironori Kanbayashi, Tokyo (JP); Koichi Yatsuka, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/938,861

(22) Filed: Sep. 10, 2004

(65) Prior Publication Data

US 2005/0138505 A1 Jun. 23, 2005

(30) Foreign Application Priority Data

Sep. 12, 2003 (JP) ............................ 2003-322092

(51) Int. Cl.
*G01R 31/26* (2006.01)
(52) U.S. Cl. .................... 324/765; 324/73.1; 714/724
(58) Field of Classification Search ................ 324/765, 324/754, 158.1, 72.5; 714/719, 720, 724
See application file for complete search history.

(56) References Cited

U.S. PATENT DOCUMENTS

| | | | |
|---|---|---|---|
| 5,488,325 A | | 1/1996 | Sato et al. |
| 5,794,175 A | * | 8/1998 | Conner .......................... 702/119 |
| 6,058,055 A | * | 5/2000 | Brunelle ........................ 365/201 |
| 6,263,463 B1 | * | 7/2001 | Hashimoto .................... 714/724 |
| 6,304,119 B1 | | 10/2001 | Tseng et al. |
| 6,378,098 B1 | * | 4/2002 | Yamashita ..................... 714/742 |
| 6,452,411 B1 | * | 9/2002 | Miller et al. ................... 324/765 |
| 6,466,007 B1 | * | 10/2002 | Prazeres da Costa et al. ........................... 324/158.1 |
| 6,882,139 B1 | * | 4/2005 | Grebner et al. ............... 324/158.1 |
| 6,888,366 B1 | * | 5/2005 | Kim et al. ..................... 324/765 |
| 6,954,079 B1 | * | 10/2005 | Sugimoto et al. ............. 324/763 |
| 2003/0005360 A1 | | 1/2003 | West et al. |
| 2003/0057940 A1 | | 3/2003 | Tanimura |
| 2004/0255216 A1 | * | 12/2004 | Ichiyoshi ....................... 714/742 |

FOREIGN PATENT DOCUMENTS

| | | |
|---|---|---|
| JP | 61-176871 | 8/1986 |
| JP | 3-216568 | 9/1991 |
| JP | 1-304888 | 5/1999 |

OTHER PUBLICATIONS

International Search Report dated Dec. 28, 2004 (1 page).
Patent Abstracts of Japan; Publication No. 61-176871 dated Aug. 8, 1986 (1 page).
Patent Abstracts of Japan; Publication No. 03-216568 dated Sep. 24, 1991 (1 page).
Patent Abstracts of Japan; Publication No. 10-107661 dated May 11, 1999 (1 page).
Supplementary European Search Report dated Aug. 25, 2006 issued against corresponding European Application No. 04-78-7872, 2 pages.

* cited by examiner

*Primary Examiner*—Minh N. Tang
(74) *Attorney, Agent, or Firm*—Osha Liang LLP

(57) ABSTRACT

There is provided a test apparatus that tests an electronic device. The test apparatus includes: a plurality of test modules operable to supply test patterns used for a test of the electronic device to the electronic device; a reference clock generation unit operable to generate a reference clock; a generation circuit operable to generate timing signals that cause the plurality of test modules to operate based on the reference clock; a plurality of timing sources being provided in response to the plurality of test modules and operable to supply the timing signals to the corresponding test modules; and a control unit operable to control phases of the timing signals supplied to each of the test modules by the plurality of timing sources so that timings at which each of the test modules outputs the test patterns according to the timing signals are made to be equal.

8 Claims, 13 Drawing Sheets

TEST APPARATUS

BACKGROUND OF THE INVENTION

1. Field of the Invention

The present invention relates to a test apparatus for testing an electronic device. This patent application claims priority from a Japanese Patent Application No. 2003-322092 filed on Sep. 12, 2003, the contents of which are incorporated herein by reference.

2. Description of Related Art

Conventionally, a test apparatus for testing an electronic device, such as a semiconductor circuit, tests the electronic device by applying a predetermined pattern to the electronic device. The test apparatus includes a test module that applies the predetermined pattern or a test rate to the electronic device, and a timing control module that controls a timing at which the test module applies a pattern or the like to the electronic device.

A plurality of test modules is provided in accordance with the number of pins of an electric device to be tested, and a plurality of timing control modules is provided like a module for generating a timing of a test start, a module for generating a timing of a pattern application and so on. Conventionally, the timing control modules are respectively configured in accordance with their functions. Since no patent document related to the present invention has been founded, the explanation regarding such a document will be omitted.

SUMMARY OF THE INVENTION

Problems to be Solved by the Invention

As described above, since the timing control modules are configured in accordance with their functions conventionally, it is necessary to produce a plurality of kinds of timing control modules that raises the manufacturing cost. In addition, each timing control module has low versatility, thereby decreasing efficiency of a test of an electronic device. In order to solve such a problem, it is contemplated that the configuration that can realize all functions is provided in each module so that the function of each module is interchangeable. Thereby, the electronic device can be tested only by the module of the same kind.

However, since many functions are required to test the electronic device and consequently it is required a lot of pins to realize the functions, it is not realistic to realize all functions by single module. For this reason, it is considered that all functions are realized by a plurality of modules having the same configuration as one another. However, in this case, there is a problem that each module must be synchronized with one another.

In addition, since characteristics, e.g., timing from input to output of signals, may be different between test modules manufactured by different manufacturers, there is another problem that these test modules cannot be used simultaneously. Furthermore, there are some cases that a timing control module respectively receives fail data from the plurality of test modules and distributes plural data summarized by logical operation of the plural fail data to the plural test modules. Even in these cases, the summarization process and the distribution process have to be synchronized with each other, respectively. As described above, when a test apparatus tests the electric device using a plurality of signal sources 30 and a plurality of test modules 14, it is necessary to synchronize the signal transfer between them.

Additionally, since the summarization process and the distribution process require a plurality of registers, a circuit scale or a manufacturing cost increases. For this reason, it is necessary to reduce the number of registers. Moreover, the summarization process and the distribution process require a plurality of signal lines. Therefore, it is necessary to consider circuit layout when a plurality of signal lines are formed on a semiconductor substrate.

Means for Achieving the Objects

To solve the above problems, according to the present invention, there is provided a test apparatus that tests an electronic device. The test apparatus includes: a plurality of test modules operable to supply test patterns used for a test of the electronic device to the electronic device; a reference clock generation unit operable to generate a reference clock; a generation circuit operable to generate timing signals that cause the plurality of test modules to operate based on the reference clock; a plurality of timing sources being provided in response to the plurality of test modules and operable to supply the timing signals to the corresponding test modules; and a control unit operable to control phases of the timing signals supplied to each of the test modules by the plurality of timing sources so that timings at which each of the test modules outputs the test patterns according to the timing signals are made to be equal.

Each of the timing sources may include: a plurality of cascaded flip-flops that receives the timing signals and sequentially transfers the timing signals according to the reference clock; and a timing signal selection unit that receives the timing signals output from each of the flip-flops, selects either of the received plurality of timing signals, and supplies the selected signal to the test module in order to adjust the phases of the timing signals supplied to the test modules, the control unit controls which timing signal among the plurality of timing signals is selected by the timing signal selection unit.

A test apparatus may further include a variable delay circuit for reference clock being provided between the reference clock generation unit and the plurality of flip-flops for delaying the reference clock to supply the delayed clock to the plurality of flip-flops, the control unit may sequentially change a delay amount of the variable delay circuit for reference clock, detect the delay amount of the variable delay circuit for reference clock by which the timing at which the value of the timing signal is changed is substantially equal to the timing at which either of the plurality of flip-flops receives the value of the timing signal, and set the delay amount of the variable delay circuit for reference clock to a delay amount deviated from the detected delay amount by substantially half a period of the reference clock.

A test apparatus may further include a plurality of return circuits operable to receive fail timing signals to indicate the timing at which the fail occurs in the output patterns output from the electric device from the plurality of corresponding test modules and output the fail timing signals to the timing sources, the return circuits may be provided in response to the plurality of test modules, the control unit may control the plurality of return circuits so that the timings at which each of the return circuits outputs the fail timing signals are substantially equal.

Each of the return circuits may include: a plurality of cascaded flip-flops that receives the fail timing signals and sequentially transfers the fail timing signals according to the reference clock; and a return signal selection unit that receives the fail timing signals output from each of the flip-flops, selects either of the received plurality of fail timing signals, and supplies the selected signal to the timing source in order to adjust the timing at which the fail timing signal is supplied to the timing source, the control unit may control which fail timing signal among the plurality of timing signals is selected by the return signal selection unit.

A test apparatus may further include a variable delay circuit for return circuit being provided between the test modules and the plurality of flip-flops for delaying the fail timing signal to supply the delayed signal to the plurality of flip-flops, the control unit may sequentially change a delay amount of the variable delay circuit for return circuit, detect the delay amount of the variable delay circuit for return circuit by which the timing at which the value of the fail timing signal is changed is substantially equal to the timing at which either of the plurality of flip-flops receives the value of the fail timing signal, and set the delay amount of the variable delay circuit for return circuit to a delay amount deviated from the detected delay amount by substantially half a period of the reference clock.

The plurality of return circuits may supply the fail timing signal to each of the test modules via the timing sources. A test apparatus may further include a summarizing circuit operable to receive the fail timing signals output from the return circuits and perform logic operations based on the plurality of fail timing signals, the plurality of timing sources may supply the result of logic operations by the summarizing circuit to the corresponding test modules.

The summary of the invention does not necessarily describe all necessary features of the present invention. The present invention may also be a sub-combination of the features described above.

Effects of the Invention

According to the present invention, it is possible to easily perform the adjustment of the phase of the timing signal given to the test modules according to characteristics of the plurality of test modules.

DENOTATION OF REFERENCE NUMERALS

10 . . . reference clock generation unit, 12 . . . control unit, 14 . . . test module, 16 . . . device contact unit, 20 . . . switch matrix, 30 . . . signal source, 32 . . . counter unit, 34 . . . variable delay circuit for return circuit, 36 . . . variable delay circuit for reference clock, 38 . . . flip-flop, 40 . . . return circuit, 42 . . . a plurality of flip-flops, 44 . . . return signal selection unit, 46 . . . summarizing circuit, 48 . . . generation circuit, 50 . . . phase adjustment circuit, 52 . . . a plurality of flip-flops, 54 . . . clock selection unit, 56 . . . timing signal distributing circuit, 60 . . . timing source, 62 . . . a plurality of flip-flops, 64 . . . timing signal selection unit, 66 . . . synchronous circuit, 70 . . . clock control circuit, 72 . . . flip-flop, 74 . . . selection unit, 76 . . . counter, 78 . . . logic circuit, 80 . . . clock distributing circuit, 82 . . . distributor, 84 . . . AND circuit, 86 . . . OR circuit, 88 . . . distributor, 90 . . . output unit, 100 . . . test apparatus, 110 . . . loop circuit, 112 . . . reference clock selection unit, 114 . . . reference clock selection unit, 116 . . . OR circuit, 117 . . . AND circuit, 118 . . . distributor, 119 . . . flip-flop, 120 . . . bus, 122 . . . flip-flop, 124 . . . distributing circuit, 126 . . . flip-flop, 130 . . . operating circuit, 132 . . . flip-flop, 134 . . . OR circuit, 136 . . . flip-flop, 140 . . . distributing unit, 142 . . . flip-flop, 144 . . . distributor, 146 . . . register unit, 148 . . . AND circuit, 150 . . . OR circuit, 152 . . . flip-flop, 160 . . . summarizing unit, 162 . . . register unit, 164 . . . AND circuit, 166 . . . OR circuit, 168 . . . shift register unit, 172 . . . flip-flop, 174 . . . flip-flop, 178 . . . flip-flop, 180 . . . flip-flop, 186 . . . flip-flop unit, 188 . . . selection unit, 190 . . . AND circuit, 200 . . . electronic device, 202 . . . selector, 204 . . . writing unit, 206 . . . flip-flop, 208 . . . flip-flop, 210 . . . AND circuit, 212 . . . request signal storing unit, 214 . . . host selection unit, 216 . . . AND circuit, 218 . . . flip-flop, 220 . . . flip-flop, 222 . . . counter, 224 . . . selector, 226 . . . AND circuit, 230 . . . the first distribution point, 232 . . . the second distribution point, 234 . . . reference clock passage path, 236 . . . variable delay circuit for phase adjustment, 250 . . . OR circuit, 258 . . . master and slave selection unit

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
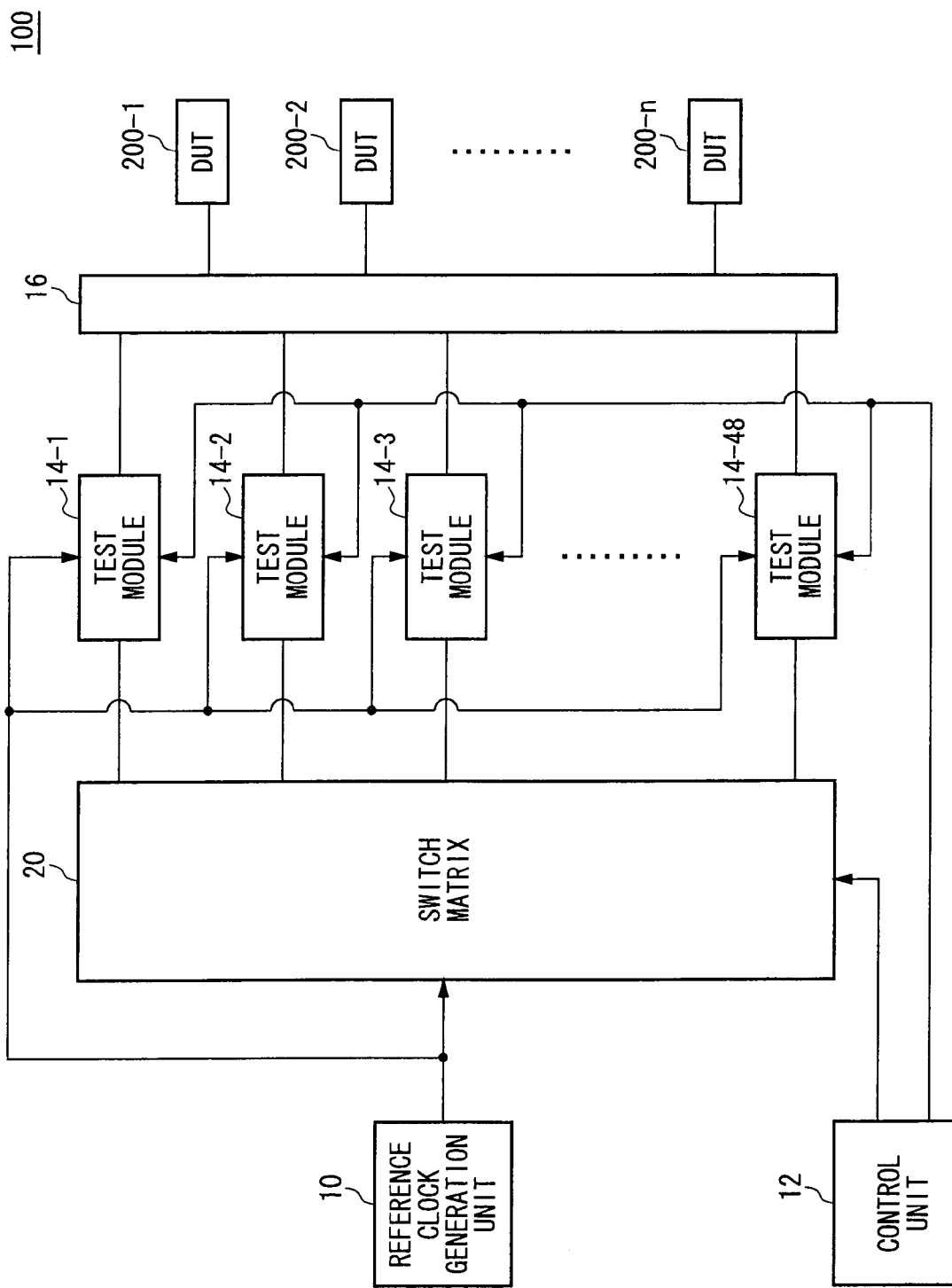
FIG. 1 is a drawing exemplary showing a configuration of a test apparatus 100 according to an embodiment of the present invention.

FIG. 1 shows an example of a configuration of a test apparatus 100 according to an embodiment of the present invention. The test apparatus 100 tests a plurality of electronic devices (200-1 to 200-n, hereinafter referred to as 200). The test apparatus 100 includes a reference clock generation unit 10, a control unit 12, a plurality of test modules (14-1 to 14-48, hereinafter referred to as 14), a device contact unit 16, and a switch matrix 20.

The device contact unit 16 is, for example, a test head on which the plurality of electronic devices 200 is mounted which electrically connects the plurality of test modules 14 and the plurality of electronic devices 200. Each test module 14 is electrically connected to one or a plurality of electronic devices 200. In addition, each electronic device 200 electrically connects with one or a plurality of test modules 14. For example, the test modules 14 and the electronic devices 200 have a predetermined number of I/O pins, respectively, and the test modules 14 and the electronic devices 200 are connected to each other in accordance with the number of pins.

In addition, the test module 14 may be a module that supplies a given test pattern to the corresponding electronic device 200. In this example, each test module 14 receives a test pattern from the control unit 12 in advance, and the test pattern is supplied to the electronic devices 200 at the timing corresponding to timing signals that are respectively given from the switch matrix 20. In addition, the test modules 14 may determine the acceptability of the electronic devices 200 based on the signals output from the electronic devices 200. In this case, the test modules 14 may have a fail memory storing fail data of the electronic devices 200 and may supply the fail data to the control unit 12.

The reference clock generation unit 10 generates a reference clock having a predetermined frequency. Each element of the test apparatus 100 operates in accordance with the reference clock. The switch matrix 20 generates a plurality of timing signals having different phases and supplies these signals to each test module 14 based on the reference clock. In other words, the switch matrix 20 supplies the timing signals to the test modules 14 to control timing at which each test module 14 operates.

The control unit 12 controls of which phase angle the switch matrix 20 supplies a timing signal to each test module 14. In addition, the control unit 12 supplies the test pattern to each test module 14 in advance. The control unit 12 may be a host computer such as a workstation. Alternatively, the control unit 12 may have a plurality of host computers. In this case, each of the electronic devices 200 to be tested is assigned to each host computer, and each host computer controls the test modules 14 connected to the assigned electronic devices 200 and a phase of timing signals supplied to the test modules 14.

Figure 2:
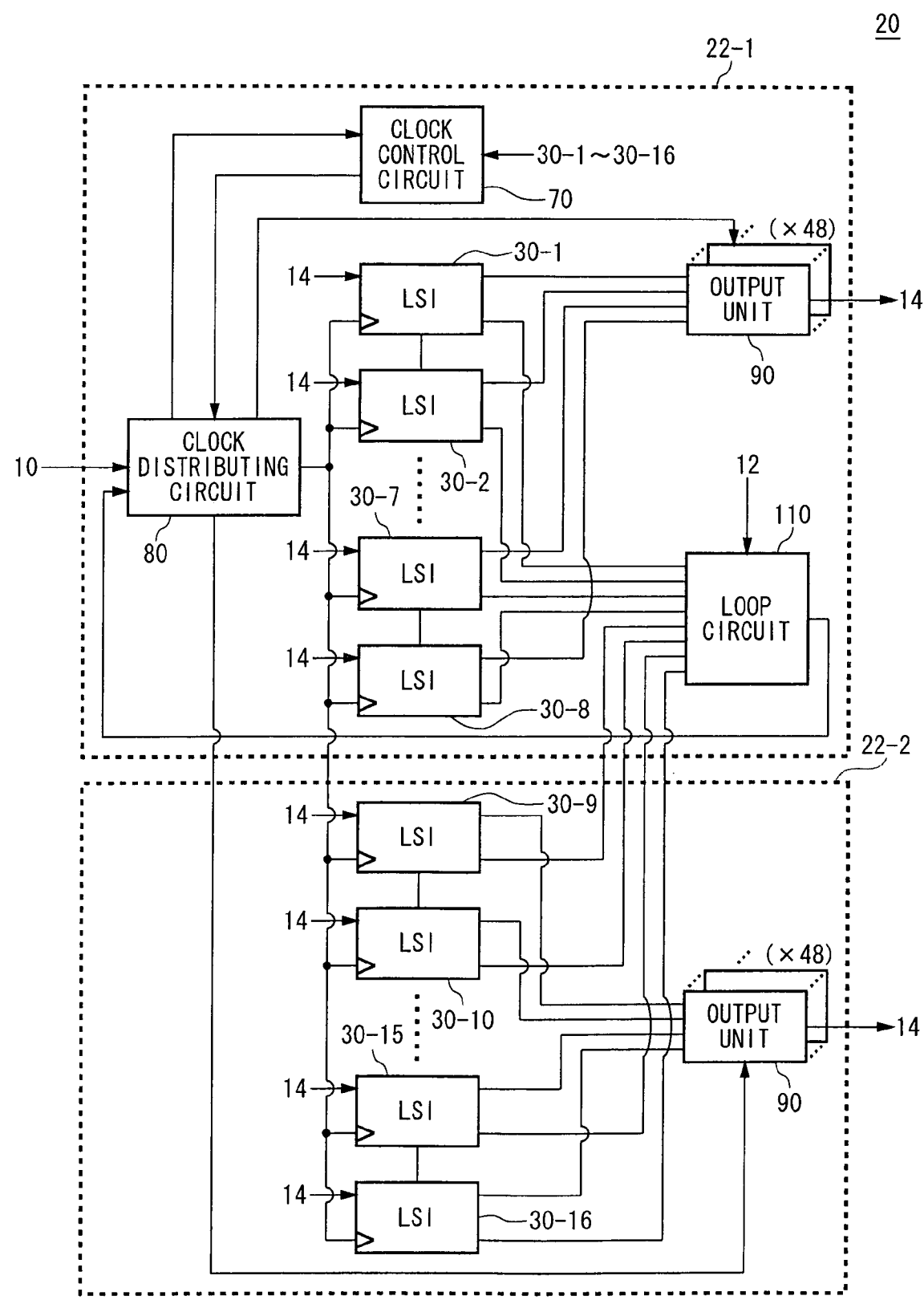
FIG. 2 is a drawing exemplary showing a configuration of a switch matrix 20.

FIG. 2 shows an example of a configuration of the switch matrix 20. The switch matrix 20 includes a plurality of testing boards (22-1, 22-2, hereinafter referred to as 22). The testing boards 22 include a reference clock distributing circuit 80, a clock control circuit 70, a plurality of signal sources (30-1 to 30-16, hereinafter referred to as 30), a plurality of output units 90, and a loop circuit 110. The configuration and operation of the loop circuit 110 and the clock control circuit 70 will be described with reference to FIG. 3.

The reference clock distributing circuit 80 receives the reference clock generated by the reference clock generation unit 10, distributing it to each element of the switch matrix 20. The signal sources 30 output signals for testing the electronic devices 200 based on the reference clock that is input as an input signal. For example, the signal sources 30 supply a timing signal to indicate timing at which the test pattern is applied to the electronic devices 200, a timing signal to indicate timing at which a test of the electronic devices 200 starts, a timing signal to indicate timing at which the test of the electronic devices 200 stops, a timing signal to indicate timing at which fail data of the electronic devices 200 is received, etc. to the test modules 14 via the output units 90.

In this example, each signal source 30 generates a plurality of timing signals having different phase as the output signals described the above based on the input reference clock. The control unit 12 switches which timing signal among the plurality of timing signals generated by the signal sources 30 is supplied to each test module 14 in each of the signal sources 30. In this way, for example, each test module 14 can control timing at which the test pattern is supplied to the electronic devices 200. In addition, the signal sources 30 output the reference clock used in the generation of the timing signals, which is synchronized with the timing signals.

The plurality of signal sources 30 are previously assigned with the functions such as the control of timing at which the test pattern is applied to the electronic devices 200, the control of timing at which a test of the electronic devices 200 starts, the control of timing at which the test of the electronic devices 200 stops, the control of timing at which fail data of the electronic devices 200 is received, etc. In addition, the signal sources 30 are integrated circuits having the same configurations with one another, having the circuit configuration that carries out all the functions described previously by switching operation modes. The operation modes are controlled by the control unit 12. In this manner, it is possible to improve the versatility of the signal sources 30 by causing each signal source 30 to have the same configuration.

In some cases, when the circuit configuration capable of carrying out all the functions described previously is included in one signal source 30, the number of I/O pins of the signal source 30 may be insufficient. In this case, the shortage of the I/O pins is compensated by combining the plurality of signal sources 30. For example, as shown in FIG. 2, the test apparatus 100 causes the signal source 30-1 and the signal source 30-2 to operate by combining them. In this example, the control unit 12 causes the combination of each of the signal sources 30 to operate by assigning either of the functions described the above to the combination of the signal sources 30.

The plurality of output units 90 is provided corresponding to the plurality of test modules 14. The plurality of output units 90 receive the timing signals from either of the plurality of signal sources 30 and supply the received timing signals to the corresponding test modules 14. The control unit 12 controls whether the timing signal from a certain signal source 30 is supplied to each output unit 90 in accordance with the function of each test module 14 and the function of each signal source 30.

Since the test apparatus 100 tests the electronic device 200 using the plurality of signal sources 30 and the plurality of test modules 14, it is preferable that the synchronized signals are sent and received therebetween. The test apparatus 100 in this example does the following adjustments.

(1) Adjustment of timing at which the plurality of signal sources 30 output the timing signals.

(2) Adjustment of a phase of the timing signals in accordance with a characteristic of the test modules 14.

(3) Adjustment of a phase of the reference clock being given to each signal source 30 when combining the plurality of signal sources 30.

First, the adjustment of timing at which the plurality of signal sources 30 outputs the timing signals will be described with reference to FIGS. 3 to 6.

Figure 3:
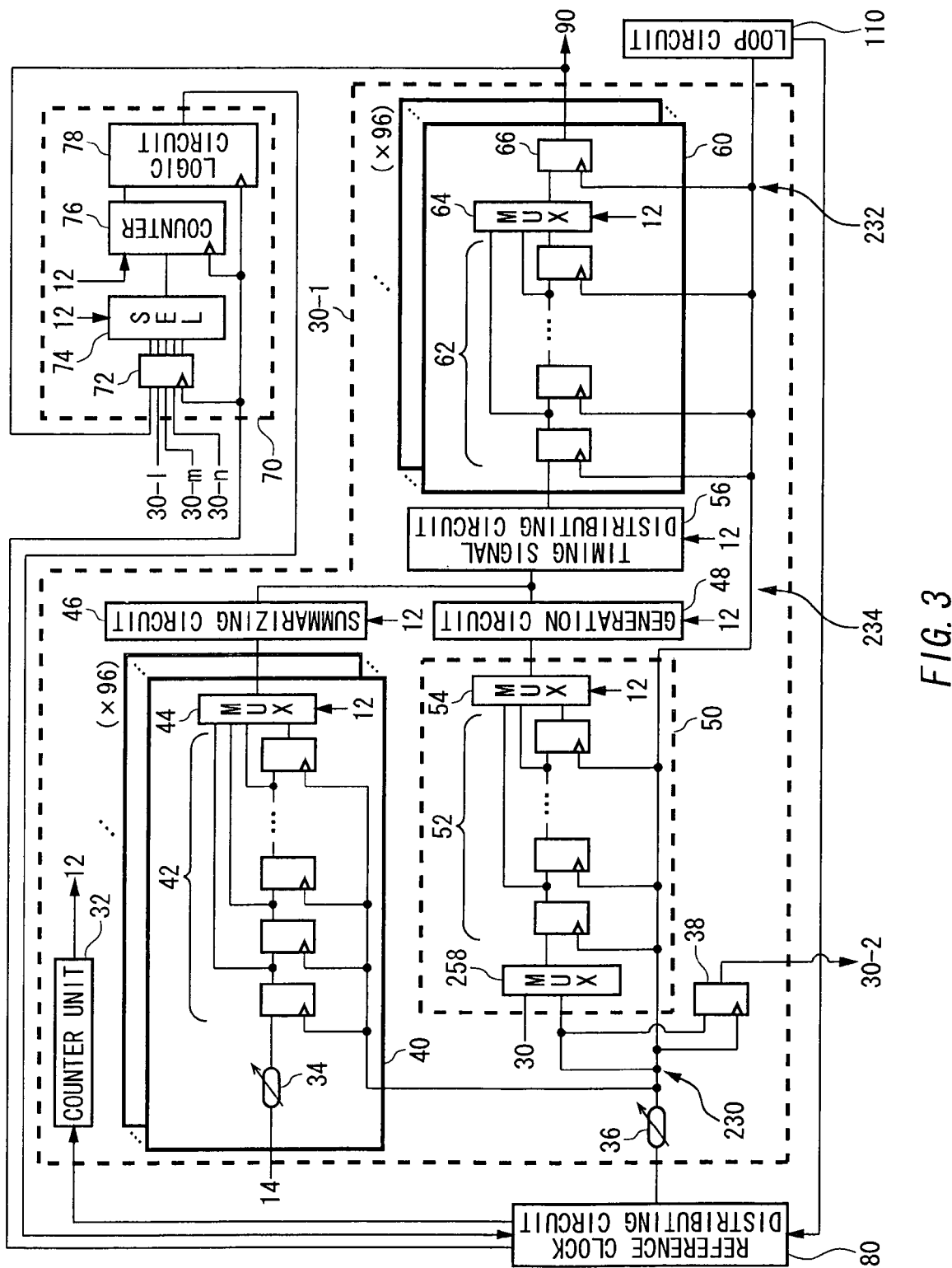
FIG. 3 is a drawing exemplary showing a configuration of a signal source 30 and a clock control circuit 70.

FIG. 3 is a drawing exemplary showing a configuration of the signal source 30 and the clock control circuit 70. The signal source 30 includes a timing signal distributing circuit 56, a summarizing circuit 46, a generation circuit 48, a plurality of return circuits 40, a plurality of timing sources 60, a phase adjustment circuit 50, a variable delay circuit for reference clock 36, a flip-flop 38, a counter unit 32, and a reference clock passage path 234. In addition, the clock control circuit 70 includes a flip-flop 72, a selection unit 74, a counter 76, and a logic circuit 78.

The reference clock passage path 234 receives a reference clock from the reference clock generation unit 10 through the reference clock distributing circuit 80, and outputs the reference clock to the loop circuit 110. The reference clock passage path 234 has a plurality of distribution points to distribute the received reference clock to each block of the signal source 30. The flip-flop or the like provided in the signal source 30 operates in accordance with the reference clock.

The variable delay circuit for reference clock 36 is provided in the reference clock passage path 234 for delaying the reference clock. Preferably, the variable delay circuit for reference clock 36 is provided above the plurality of distribution points on the reference clock passage path 234. The reference clock that passed the reference clock passage path 234 is input into the loop circuit 110.

The loop circuit 110 returns the reference clock output from each signal source 30, thereby inputting the reference clock as an input signal to each signal source 30 that has output the reference clock via the reference clock distributing circuit 80. Preferably, the loop circuit 110 returns each reference clock, which is selected sequentially, via the substantially same pass to input it into the signal sources 30. The test apparatus 100 detects a variation of timing at which each signal source 30 outputs timing signals by measuring the period of the loop. Even if the timing signals are supplied from the plurality of signal sources 30 to the plurality of test modules 14, it is possible to synchronize the plurality of test modules 14 with each other by adjusting timing at which each signal source 30 outputs timing signals.

Figure 4:
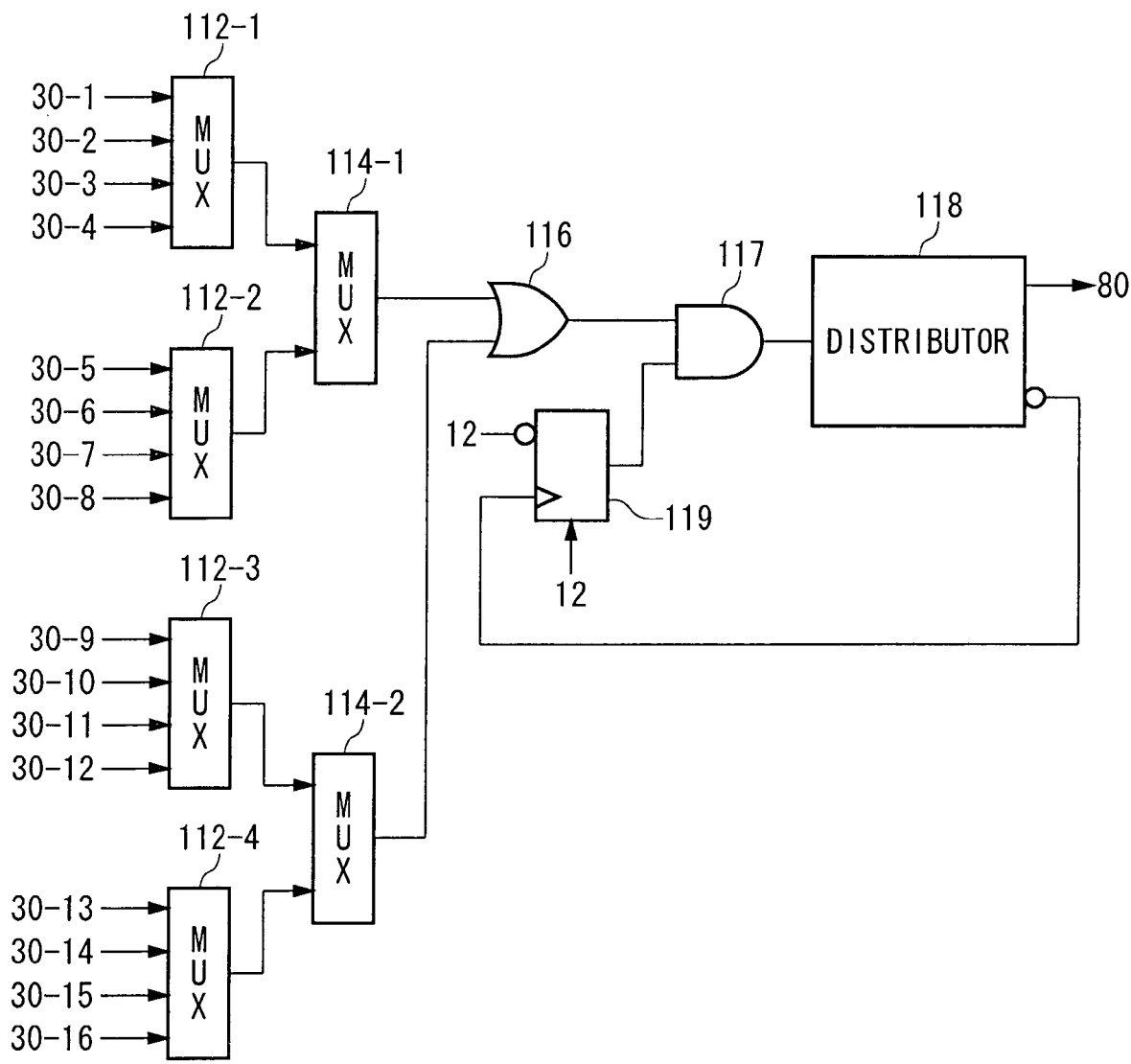
FIG. 4 is a drawing exemplary showing a configuration of a loop circuit 110.

FIG. 4 is a drawing exemplary showing a configuration of the loop circuit 110. The loop circuit 110 includes a plurality of reference clock selection unit (112-1 to 112-4, 114-1 to 114-2), an OR circuit 116, an AND circuit 117, a flip-flop 119, and a distributor 118. The loop circuit 110 receives the reference clock output from the plurality of signal sources 30, sequentially selecting and looping the received reference clock.

In this example, the plurality of reference clock selection unit (112-1 to 112-4, 114-1 to 114-2) and the OR circuit 116 select one reference clock among the plurality of reference clocks. The AND circuit 117 outputs a logical product of the selected reference clock and a signal output from the flip-flop 119 to the distributor 118. The flip-flop 119 controls whether a loop of the reference clock is realized. A signal for controlling whether a loop of the reference clock is realized is supplied from the control unit 12 to the flip-flop 119, with the flip-flop 119 outputting that signal in accordance with an inversion signal of the reference clock given from the distributor 118. The distributor 118 loops the reference clock output from the AND circuit 117 to the reference clock distributing circuit 80. The loop 110 returns each reference clock selected sequentially to the reference clock distributing circuit 80 via the same path. In this way, it is possible to reduce a measurement error of the period of each signal source 30.

Figure 5:
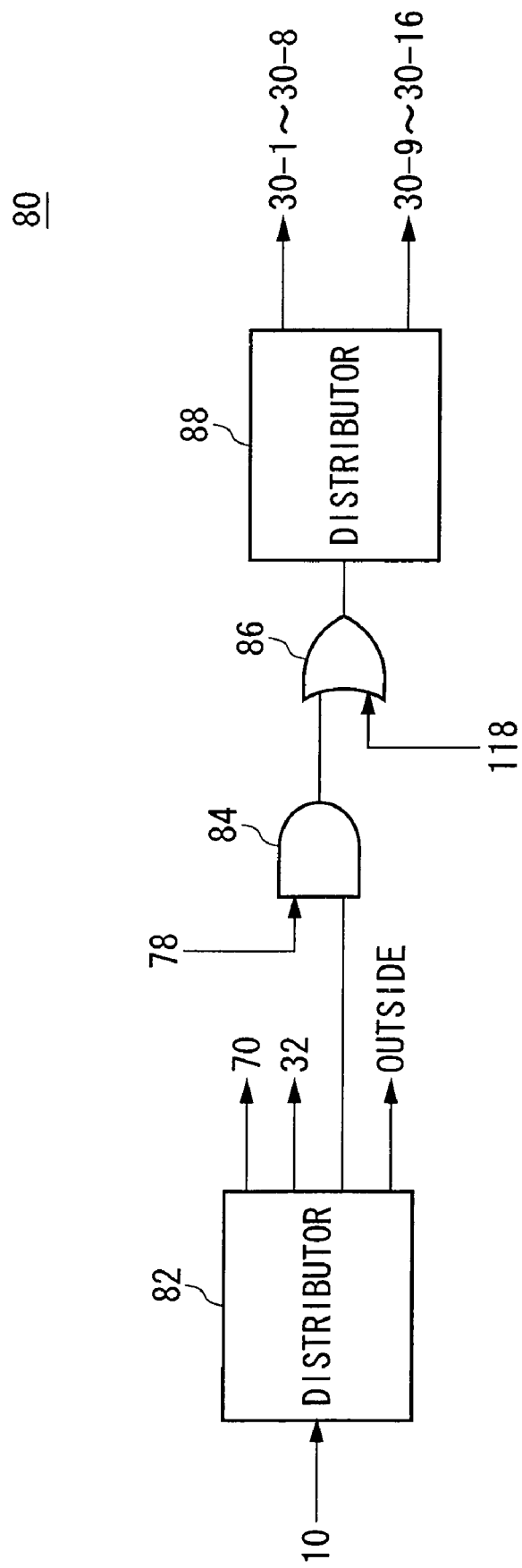
FIG. 5 is a drawing exemplary showing a configuration of a reference clock distributing circuit 80.

FIG. 5 is a drawing exemplary showing a configuration of the reference clock distributing circuit 80. The reference clock distributing circuit 80 includes a distributor 82, an AND circuit 84, an OR circuit 86, and a distributor 88. The distributor 82 receives a reference clock from the reference clock generation unit 10, distributing the reference clock to the elements that is to operate in accordance with the reference clock. The AND circuit 84 receives the reference clock from the distributor 82, outputting a logical product of a signal supplied from the clock control circuit 70 described below and the reference clock. In other words, the AND circuit 84 chooses whether the reference clock is passed based on the signal supplied from the clock control circuit 70.

The OR circuit 86 outputs a logical sum of the reference clock received from the AND circuit 84 and the reference clock looped from the loop circuit 110. When measuring a period of the loop, the clock control circuit 70 inputs a logic L into the AND circuit 84 and controls so as not to pass the reference clock being supplied from the reference clock generation region 10. When not measuring the period of the loop, the clock control circuit 70 inputs a logic H into the AND circuit 84. The distributor 88 supplies the reference clock output from the OR circuit 86 to the plurality of signal sources 30. When measuring the period of the loop, the distributor 88 supplies the received reference clock to the signal source 30 that is measuring the period of the loop.

In addition, it is preferable that the loop circuit 110 continuously loops the reference clock received from one of the signal sources 30. In other words, it is preferable to loop each reference clock within a predetermined time for multiple times. The counter unit 32 (see FIG. 3) counts how many times the reference clock is looped within a predetermined time, measuring a period for the signal source 30 corresponding to the reference clock that is sequentially looped by the loop circuit 110 based on the counted result.

For example, the counter unit 32 receives the reference clock from the distributor 82, counting how many times the loop circuit 110 loops the reference clock while counting a pulse of the reference clock by a predetermined times. In this case, the reference clock looped by the loop circuit 110 is input into the counter unit 32.

The counter unit 32 measures a period from input of the input signal (the reference clock) to input of the loop signal (the reference clock) with respect to each of the signal sources 30 based on these counted results. By looping the reference clock more than once, it is possible to measure the period for each of the signal sources 30 with high precision. For example, it is preferable that the loop circuit 110 loops each reference clock around 4000 times.

The control unit 12 controls delay time of the variable delay circuit for reference clock 36 provided in each of the signal sources 30 based on the period for each of the signal sources 30 measured by the counter unit 32 so that the periods of the signal sources 30 are substantially the same as one another. By such a control, it is possible to reduce a misalignment of the output timing of the timing signals that are generated by a variation between the plurality of signal sources 30.

In addition, the reference clock is distributed from the first distribution point 230 on the reference clock passage path 234 to the generation circuit 48 of the signal source 30 via the phase adjustment circuit 50. Based on the distributed reference clock, the generation circuit 48 generates a plurality of timing signals having different phases. In this example, the generation circuit 48 generates a plurality of timing signals having different phases by the phase resolution equal to the period of the reference clock.

The timing signal distributing circuit 56 selects either timing signal out of the plurality of timing signals generated from the generation circuit 48 with respect to every timing source 60, supplying the selected timing signal to each of the timing sources 60. The plurality of timing sources 60 is provided corresponding to one output unit 90 per two timing sources 60, supplying the timing signal to the corresponding output unit 90. The reference clock is distributed from the second distribution point 232 provided downstream of the first distribution point 230 on the reference clock passage path 234 to each of the timing sources 60. Each of the timing sources 60 includes a synchronous circuit 66 that outputs the timing signal selected by the timing signal distributing circuit 56 in synchronization with the distributed reference clock.

The loop circuit 110 receives the reference clock that has passed the second distribution point 232 in order to loop the received reference clock. Since the control unit 12 controls an amount of delay of the variable delay circuit for reference clock 36, timings at which the reference clock is distributed to the synchronous circuits 66 of the plurality of signal sources 30 may become substantially the same as one another. For this reason, the plurality of signal sources 30 can output timing signals with substantially the same timing as one another.

In addition, it is preferable that the reference clock passage path 234 has the second distribution point 232, which is located most downstream among a plurality of distribution points. In addition, it is preferable that each of the signal sources 30 outputs the reference clock from the neighborhood of the second distribution point 232 to the loop circuit 110 in a semiconductor substrate on which the signal sources 30 are formed. By measuring a period of the loop of the reference clock after shortening the path from the second distribution point 232 to the loop circuit 110, it is possible to reduce a misalignment of phases between the reference clock received by the loop circuit 110 and the timing signal output from the signal source 30 outputs. For this reason, it is possible to reduce a misalignment of timing at which each of the signal sources 30 outputs the timing signals.

In addition, the test apparatus 100 can supply a test pattern from the plurality of test modules 14 to one electronic device 200. The control unit 12 may control an amount of delay of each variable delay circuit for reference clock 36 so that the periods for the signal sources 30 that supply the timing signals to the plurality of test modules 14 for supplying the test pattern to one electronic device 200 may become substantially the same as one another.

Figure 6:
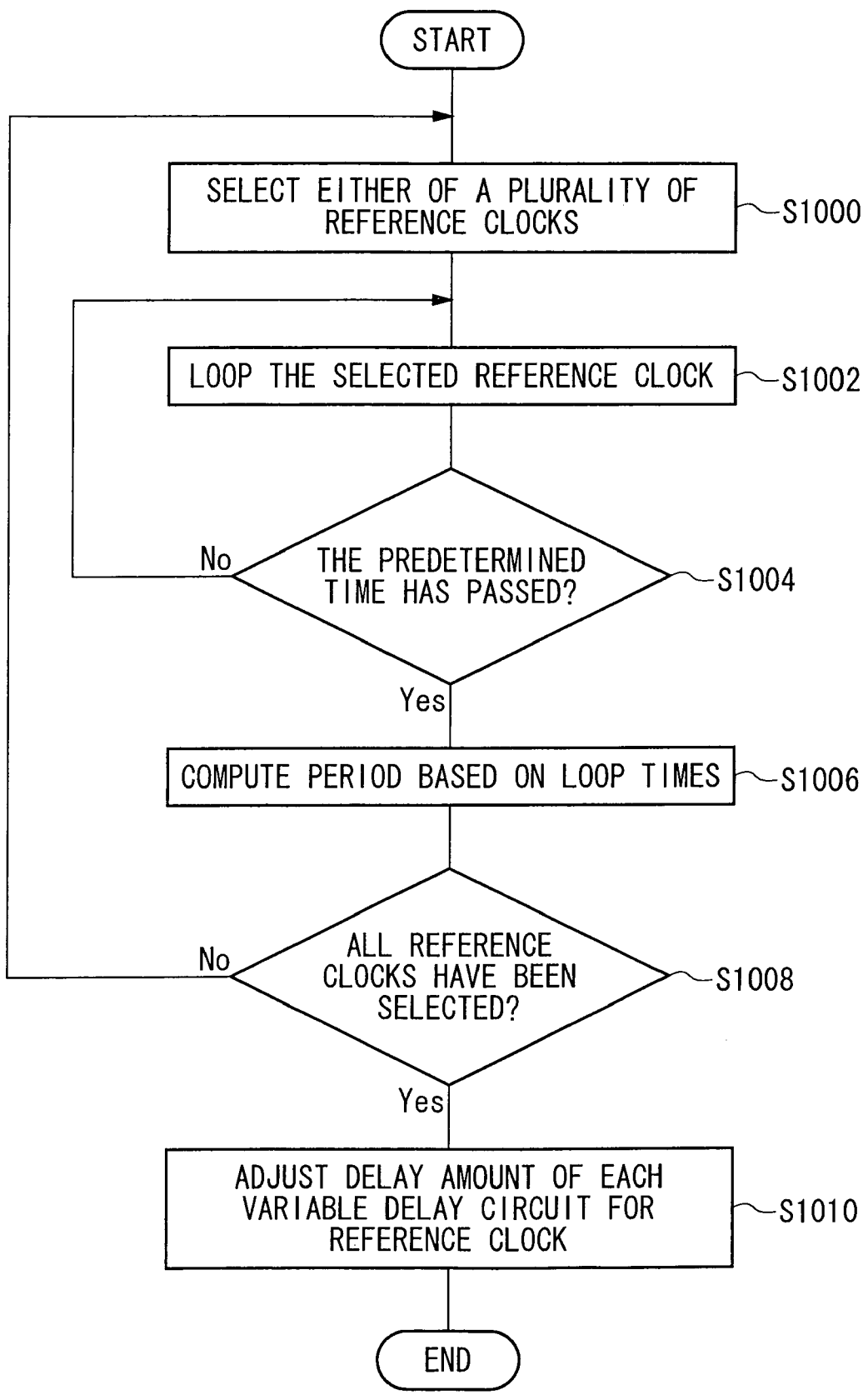
FIG. 6 is a flowchart exemplary showing a timing adjusting method in which a plurality of signal sources 30 outputs timing signals, explained in FIGS. 3 to 5.

FIG. 6 is a flowchart showing an example of a timing adjusting method in which the plurality of signal sources 30 outputs the timing signals, explained in FIGS. 3 to 5. At first, in the step S1000, the loop circuit 110 selects either of the plurality of reference clocks output from the plurality of signal sources 30. Next, in the step S1002, the loop circuit 110 loops the selected reference clock, inputting the looped signal into the signal source 30 that has output that reference clock.

In the step S1004, the counter unit 32 determines whether a predetermined time has elapsed, and when the predetermined time has not elapsed, it continues to loop the reference clock. When the predetermined time has elapsed, the period for that signal source 30 is computed based on the number of loops of the reference clock in the step S1006. Next, in the step S1008, it is determined whether all reference clocks output from the plurality of signal sources 30 have been selected. When all reference clocks have not been selected, the next reference clock (S1000) is selected and the processes of the steps S1002 to S1006 are repeated.

When all the reference clocks are selected and the periods for all the signal sources 30 are computed, in the step S1010, the delay amount of the variable delay circuit for reference clock 36 of each of the signal sources 30 is adjusted, the timing at which each signal source 30 outputs the timing signals is uniformed, and the adjustment is finished.

Next, the adjustment of the phase of the timing signals according to characteristics of the test modules 14 is described using FIGS. 3 and 7. As described above, the plurality of timing sources 60 of the signal source 30 is provided corresponding to the plurality of test modules 14. However, in each test module 14, it is not necessary that the time intervals from the reception of the timing signals to the output of the test patterns are the same as one another. For example, the time intervals have a variation according to characteristics of each of the test modules 14. For this reason, although the timing signals are simultaneously input into the plurality of test modules 14, the test patterns are not simultaneously input into the electronic devices 200 in some cases. The test apparatus 100 in this example adjusts the phase of the timing signals that each signal source 30 outputs in order to compensate for the variation.

As shown in FIG. 3, each timing source 60 includes a plurality of flip-flops 62, a timing signal selection unit 64, and a synchronous circuit 66 in series. In addition, each timing source 60 is provided corresponding to the plurality of test modules 14, receiving the timing signals from the timing signal distributing circuit 56 and supplying the timing signals to the corresponding test modules 14.

The generation circuit 48 generates a timing signal having only one falling edge or only one rising edge in the predetermined time, supplying it to the timing signal distributing circuit 56. It is preferable that the predetermined time is sufficiently longer than the period of the reference clock. The plurality of flip-flops 62 receives the timing signal from the timing signal distributing circuit 56, sequentially transferring the timing signal to the flip-flop of the next stage based on the reference clock distributed from the reference clock passage path 234. In other words, each flip-flop of the plurality of flip-flops 62 transfers a value of the timing signal to the flip-flop of the next stage in accordance with the reference clock.

A timing signal selection unit 64 receives the timing signals output from each flip-flop of the plurality of flip-flops 62, supplying either of the received timing signals to the test module in order to adjust the phase of the timing signal being supplied to the test module.

The control unit 12 controls the phase of the timing signals that are supplied by the plurality of timing sources 60 to each of the test modules 14. In this example, the control unit 12 controls which timing signal the timing signal selection unit 64 selects among the plurality of timing signals, so that the timings at which each test module 14 outputs the test pattern based on the timing signal become substantially equal. Preferably, the test apparatus 100 has means for detecting the timing at which the test module 14 outputs the test pattern.

In this example, the plurality of return circuits 40 detects the timing at which the test module 14 outputs the test pattern. The plurality of return circuits 40 are provided corresponding to the plurality of test modules 14 similarly to the plurality of timing sources 60. The test module 14 inputs a signal having a value being changed by the timing at which the test pattern is output into the corresponding return circuit 40. The return circuit 40 includes a plurality of flip-flops 42 in series. Each flip-flop of the plurality of flip-flops 42 sequentially transfers the signals input from the test modules 14 to the flip-flop of the next stage in accordance with the reference clock.

The control unit 12 reads the values stored on the plurality of flip-flops 42, detecting the timing at which the test modules 14 output the test patterns based on whether the value of the flip-flop of a certain stage varies. In addition, the phase of the timing signal to be supplied to each test module 14 may be previously given to the control unit 12 based on a specification of each test module 14.

In addition, the control unit 12 may sequentially change a delay amount of the variable delay circuit for reference clock 36, may detect the delay amount by which the timing at which the value of the timing signal is changed is substantially identical with the timing at which either of the plurality of flip-flops 62 receives the value of the timing signal, and may set the delay amount of the variable delay circuit for reference clock 36 to a delay amount deviated from the detected delay amount by half of the period of the reference clock. In this case, it is preferable that the control unit 12 has means for detecting the values of the timing signals stored on each flip-flop of the plurality of flip-flops 62.

At first, the control unit 12 sets the delay amount of the variable delay circuit for reference clock 36 to the predetermined value. The control unit 12 causes the generation circuit 48 to generate the timing signals based on the reference clock received from the reference clock distributing circuit 80, detecting each value stored on the plurality of flip-flops 62 to detect the number of stage of the flip-flop of which the value is to be changed. Next, the control unit 12 changes the delay amount of the variable delay circuit for reference clock 36 by a predetermined amount. After that, similarly, the control unit 12 causes the generation circuit 48 to generate the timing signals, and detect each value stored on the plurality of flip-flops 62 to detect the number of stage of the flip-flop having the changed value. In this way, whenever a delay amount of the variable delay circuit for reference clock 36 is changed sequentially, the control unit 12 detects each value stored on the plurality of flip-flops 62 to detect number of stage of the flip-flop having the changed value. The delay amount by which the timing at which the value of the timing signal is changed is substantially identical with the timing at which either of the plurality of flip-flops 62 receives the value of the timing signal is detect by detecting the delay amount by which number of stage of the detected flip-flop is changed. Then, the delay amount of the variable delay circuit for reference clock 36 is set to the delay amount deviated from the detected delay amount by half a period of the reference clock. By such a control, it is possible to stably detect the value of the timing signals in each of the flip-flops.

Figure 7A:
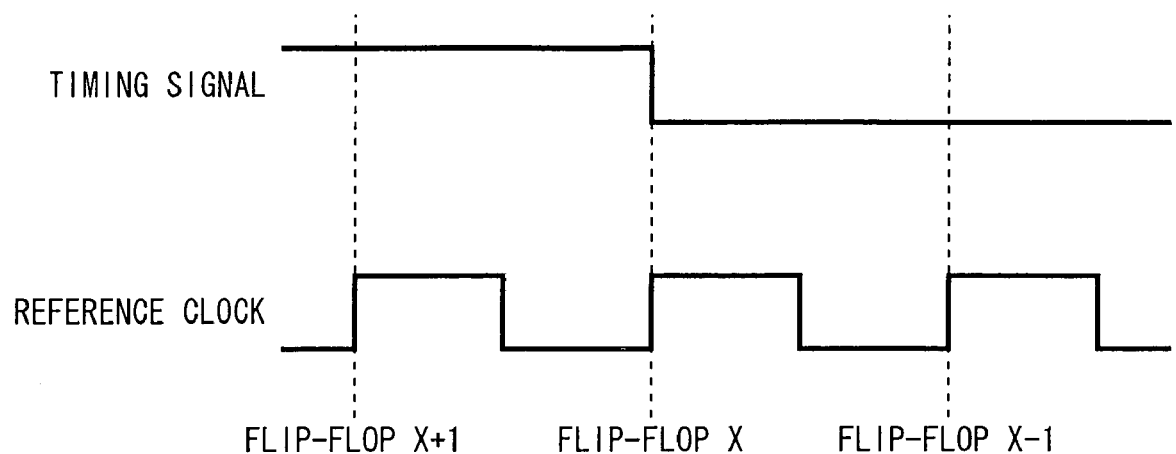
FIG. 7A is a drawing exemplary showing a case where a delay amount of a variable delay circuit for reference clock 36 is not adjusted.
Figure 7B:
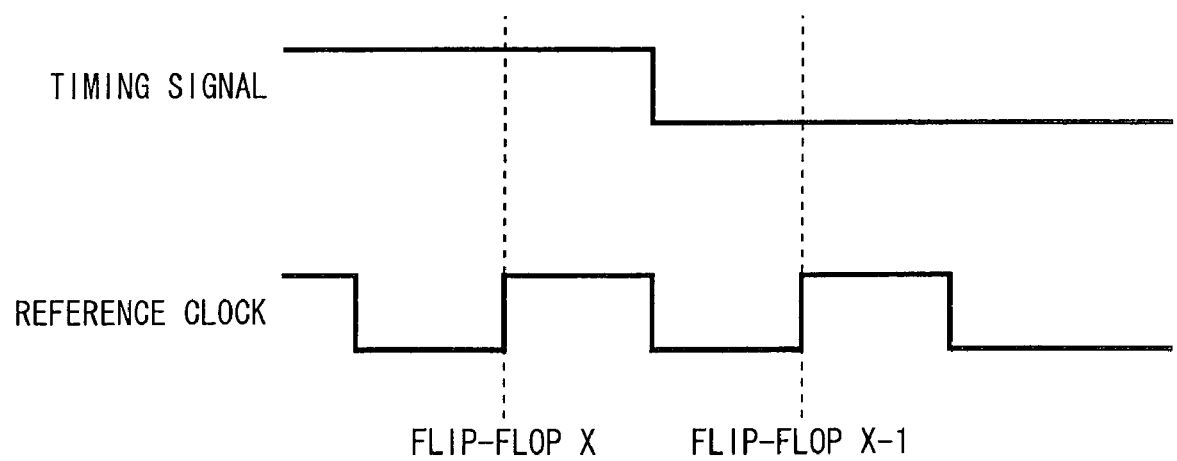
FIG. 7B is a drawing exemplary showing a case where a delay amount of the variable delay circuit for reference clock 36 is adjusted.

FIGS. 7A and 7B are drawings showing a relationship between the timing signal and the reference clock. That is, FIG. 7A is a drawing exemplary showing a case where a delay amount of the variable delay circuit for reference clock 36 is not adjusted and FIG. 7B is a drawing exemplary showing a case where a delay amount of the variable delay circuit for reference clock 36 is adjusted.

When the delay amount of the variable delay circuit for reference clock 36 is not adjusted, as shown in FIG. 7A, the value of the timing signal can be received at the timing at which the value of the timing signal is changed in some cases when either of the plurality of flip-flops 62 receives the value of the timing signal in accordance with the reference clock. In this case, it is not possible that the flip-flop stably receives the value of timing signal.

For this reason, the control unit 12, in this example, adjusts the delay amount of the variable delay circuit for reference clock 36 as described above, so that the timing at which the flip-flop receives the value of the timing signal and the timing at which the value of the timing signal varies are deviated from each other as shown in FIG. 7B.

In addition, each return circuit 40 receives the signals such as fail timing signals to indicate the timing at which the fail occurs in the output patterns output from the electric devices 200 from the plurality of corresponding test modules 14, supplying the fail timing signals to the timing sources 60 via the summarizing circuit 46 and the timing signal distributing circuit 56. At this time, the fail timing signals of each return circuit 40 can have phase lag by a characteristic of each test module 14 in some cases. In other words, there is a case where the time interval from the generation of the fail timing signals to the supply to each return circuit 40 is different depending on the test modules 14.

When the test apparatus 100 detects a fail, for example, at either of the test modules 14, the test apparatus 100 can control the operations of the plurality of test modules 14 based on the signals supplied from the test modules 14 to the signal sources 30 so as to stop the application of the test patterns in the plurality of test modules 14, for example. In this case, when the time interval from the generation of the fail timing signals to the supply to each return circuit 40 is different depending on the test modules 14, it is not possible to synchronize the plurality of test modules 14 with each other. The control circuit 12 controls the plurality of return circuits 40 to compensate the lag so that the timing at which each return circuit 40 outputs the fail timing signals is substantially identical.

In this example, each return circuit 40 includes the plurality of flip-flops 42, a variable delay circuit for return circuit 34, and a return signal selection unit 44. Each flip-flop of the plurality of flip-flops 42 receives the fail timing signals and transfers the fail timing signals to the flip-flop of the next stage in accordance with the reference clock distributed from the reference clock passage path 234.

The return signal selection unit 44 receives the fail timing signals output from each flip-flop of the plurality of flip-flops 42, selecting either of the plurality of received fail timing signals. The return signal selection unit 44 controls the timing at which the fail timing signals are supplied to the timing sources 60 by supplying the selected fail timing signal to the timing sources 60 via the summarizing circuit 46 and the timing signal distributing circuit 56.

The control unit 12 controls the phase of the fail timing signal that the plurality of return circuit 40 supplies to each of the timing sources 60. In this example, the control unit 12 controls which of the plurality of fail timing signals is to be selected by the return signal selection unit 44. In this example, a control unit 12 reads the value stored on the plurality of flip-flops 42, and detects at what number of the flip-flop the value is changed. Then, according to the difference in each return system circuit 40 of the detected number of flip-flop, it controls which fail timing signal the return signal selection unit 44 is made to choose.

In addition, the variable delay circuit for return circuit 34 is provided between the test module 14 and the plurality of flip-flops 42, supplying the delayed fail timing signal to the plurality of flip-flops 42. The control circuit 12 sequentially changes a delay amount of the variable delay circuit for return circuit 34, detects the delay amount of the variable delay circuit for return circuit 34 by which the timing at which the value of the fail timing signal is changed is substantially identical with the timing at which either of the plurality of flip-flops 42 receives the value of the fail timing signal, and sets the delay amount of the variable delay circuit for return circuit 34 to a delay amount deviated from the detected delay amount by half a period of the reference clock.

In addition, when the value stored on each flip-flop of the plurality of flip-flops (42, 52, 62) is detected, it is preferable to stop the reference clock supplied from the reference clock distributing circuit 80 and to stop operations of the plurality of flip-flops (42, 52, 62). In this example, the clock control circuit 70 supplies a signal to stop the reference clock to the reference clock distributing circuit 80.

The clock control circuit 70 has the flip-flop 72, the selection unit 74, the counter 76, and the logic circuit 78. The flip-flop 72 receives the timing signals output from the plurality of signal sources 30, supplying them to the selection unit 74. The selection unit 74 selects the timing signal output from the signal source 30 in which the timing or the phase is adjusted among the plurality of timing signals received from the flip-flop 72, supplying it to the counter 76. The counter 76 starts to count the reference clock when the value of the received timing signal is varied and outputs a signal to indicate the stop of the reference clock to the logic circuit 78 when the counted value becomes the predetermined number. The logic circuit 78 supplies the signal received from the counter 76 to the AND circuit 84 of the reference clock distributing circuit 80, stopping the reference clock being supplied to the signal source 30.

The control unit 12 sets a predetermined number to the counter 76, counting the timing to stop the reference clock. For example, the control unit 12 controls the counter 76 so that the flip-flop, which is provided in the substantially central area, among the plurality of flip-flops 42 detects the change of the values of the fail timing signals.

In addition, the plurality of return circuits 40 supplies the fail timing signals to each test module 14 via the summarizing circuit 46, the timing signal distributing circuit 56, and the timing sources 60. The summarizing circuit 46 receives the fail timing signals output from the plurality of return circuits 40, performs a plurality of types of logical operation based on the plurality of fail timing signals, and supplies each operation result to the timing signal distributing circuit 56. The timing signal distributing circuit 56 supplies each of the received operation results to any one or the plurality of timing sources 60. The configuration of the summarizing circuit 46 and the timing signal distributing circuit 56 will be described below with reference to FIGS. 8 and 9.

Next, when combining the plurality of signal sources 30, the adjustment of the phase of the reference clock given to each of the signal sources 30 will be described using FIGS. 3 and 8. When combining the plurality of signal sources 30, either of the combined signal sources 30 functions as a main signal source that generates a first timing signal for controlling the timing at which the test module 14 supplies the test pattern to the electronic device 200 in accordance with the phase of the reference clock and supplies it to one or plural pins predetermined of the test module 14. In addition, another signal source 30 functions as a sub-signal source that receives the reference clock from the main signal source, generates a second timing signal for controlling the timing at which the test module 14 supplies the test pattern to the electronic device 200 in accordance with the phase of the received reference clock, and supplies it to one or plural pins different from the main signal source among the pins of the test module 14. In this example, it will be described about a case where the signal source 30-1 functions as the main signal source and the signal source 30-2 functions as the sub-signal source.

When the signal source 30 functions as the sub-signal source 30, each of the signal source 30 includes the phase adjustment circuit 50 to delay the reference clock received from the main signal source 30. In the phase adjustment circuit 50, the reference clock is distributed from the first distribution point 230 of the reference clock passage path 234. At this time, it is preferable that a clock changing circuit for changing the reference clock into a clock sufficiently larger than the reference clock between the first distribution point 230 and the phase adjustment circuit 50.

In addition, when each signal source 30 functions as the main signal source, each signal source 30 includes the flip-flop 38 for supplying the reference clock to the sub-signal source. The flip-flop 38 receives the reference clock changed by the clock changing circuit, supplying it to the sub-signal source.

In addition, when the signal source 30 functions as the sub-signal source, the phase adjustment circuit 50 receives the reference clock from the flip-flop 38 of the main signal source. The phase adjustment circuit 50 adjusts the phase of the received reference clock to supply it to the generation circuit 48. The generation circuit 48, the timing signal distributing circuit 56, and the timing source 60 generate the timing generating signals based on the phase of the received reference clock, supplying them to the test modules 14. Here, the phase adjustment circuit 50 of the sub-signal source substantially uniforms the timing at which the main signal source outputs the first timing signal and the timing at which the sub-signal source outputs the second timing signal by delaying the reference clock received from the main signal source.

Figure 8:
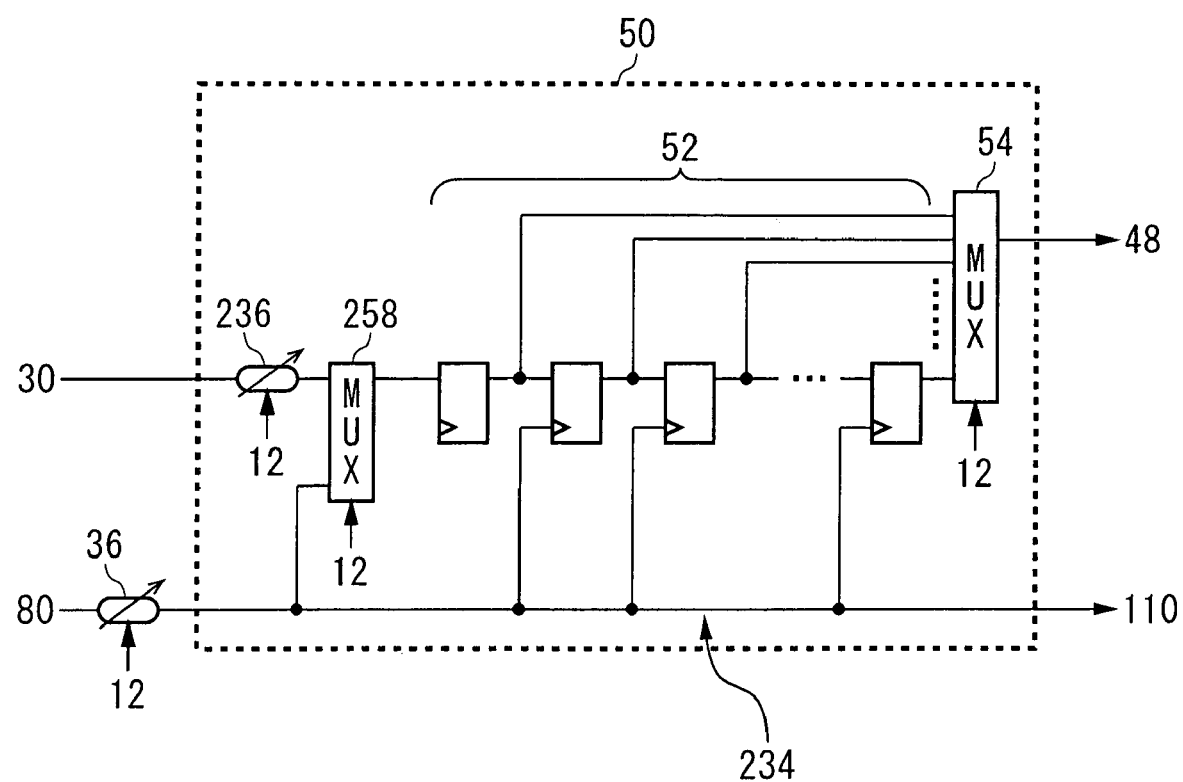
FIG. 8 is a drawing exemplary showing a configuration of a phase adjustment circuit 50.

FIG. 8 is a drawing exemplary showing a configuration of the phase adjustment circuit 50. The phase adjustment circuit 50 includes a variable delay circuit for phase adjustment 236, a plurality of cascaded flip-flops 52, a master and slave selection unit 258, and a clock selection unit 54. The master and slave selection unit 258 selects whether either of a reference clock delayed by the variable delay circuit for phase adjustment 236 or a reference clock generated by the reference clock generation unit 10 and delayed by the variable delay circuit for reference clock 36 is to be supplied to the plurality of flip-flops 52.

The control unit 12 controls which reference clock is selected by the master and slave selection unit 258 based on whether the signal source 30 functions as either the main signal source or the sub-signal source. In other words, when the signal source 30 functions as the main signal source, the master and slave selection unit 258 selects the reference clock delayed by the variable delay circuit for reference clock 36, and when the signal source 30 functions as the sub-signal source, the master and slave selection unit 258 selects the reference clock delayed by the variable delay circuit for phase adjustment 236.

The plurality of flip-flops 52 receives the reference clock selected by the master and slave selection unit 258, sequentially transferring the received reference clock in accordance with the reference clock generated from the reference clock generation unit 10 and distributed by the reference clock passage path 234. The clock selection unit 54 receives the reference clocks output from each flip-flop of the plurality of flip-flops 52, selecting either of the received plurality of reference clocks to output the selected reference clock as the second timing signal via the generation circuit 48, the timing signal distributing circuit 56, and the timing source 60.

The control unit 12 controls whether the clock selection unit 54 selects either of the reference clocks, and thus uniforms the timing at which the main signal source outputs the first timing signal and the timing at which the sub-signal source outputs the second timing signal. For example, the control unit 12 causes the clock selection unit 54 of the main signal source to select the reference clock output from the predetermined flip-flop, controlling whether the clock selection unit 54 of the sub-signal source selects either of the reference clocks in order to uniform the timing at which the main signal source outputs the first timing signal and the timing at which the sub-signal source outputs the second timing signal. In this case, it is preferable that the control unit 12 causes the clock selection unit 54 of the main signal source to select the reference clock output from the flip-flop, which is provided in the substantially central area, among the plurality of cascaded flip-flops 52.

By such a control, it is possible to adjust an error between the timing at which the first timing signal is output and the timing at which the second timing signal is output due to a variation of the phases of the reference clocks given to each signal source 30 when the plurality of signal sources 30 is combined together.

In addition, the variable delay circuit for phase adjustment 236 delays the reference clock received from the main signal source to supply it to the master and slave selection unit 258. The control unit 12 sequentially changes a delay amount of the variable delay circuit for phase adjustment 236, detects the delay amount of the variable delay circuit for phase adjustment 236 by which the timing at which the value of the reference clock is changed is substantially identical with the timing at which either of the plurality of flip-flops 52 receives the value of the reference clock, and sets the delay amount of the variable delay circuit for phase adjustment 236 to the delay amount deviated from the detected delay amount by half a period of the reference clock. It is preferable that the setting of the variable delay circuit for phase adjustment 236 is performed before the adjustment of number of stage of the flip-flop selected by the clock selection unit 54.

As described in FIGS. 3 to 8, according to the test apparatus 100 of this example, the adjustment of the timing at which the plurality of signal sources 30 outputs the timing signals, the adjustment of the phase of the timing signal in accordance with characteristics of the test modules 14, and the adjustment of the phase of the reference clock given to each of the signal sources 30 when the plurality of signal sources 30 is combined can be performed. Furthermore, it is possible to test the electronic device 200 with high precision by operating the plurality of test modules 14 in synchronization with each other.

Figure 9:
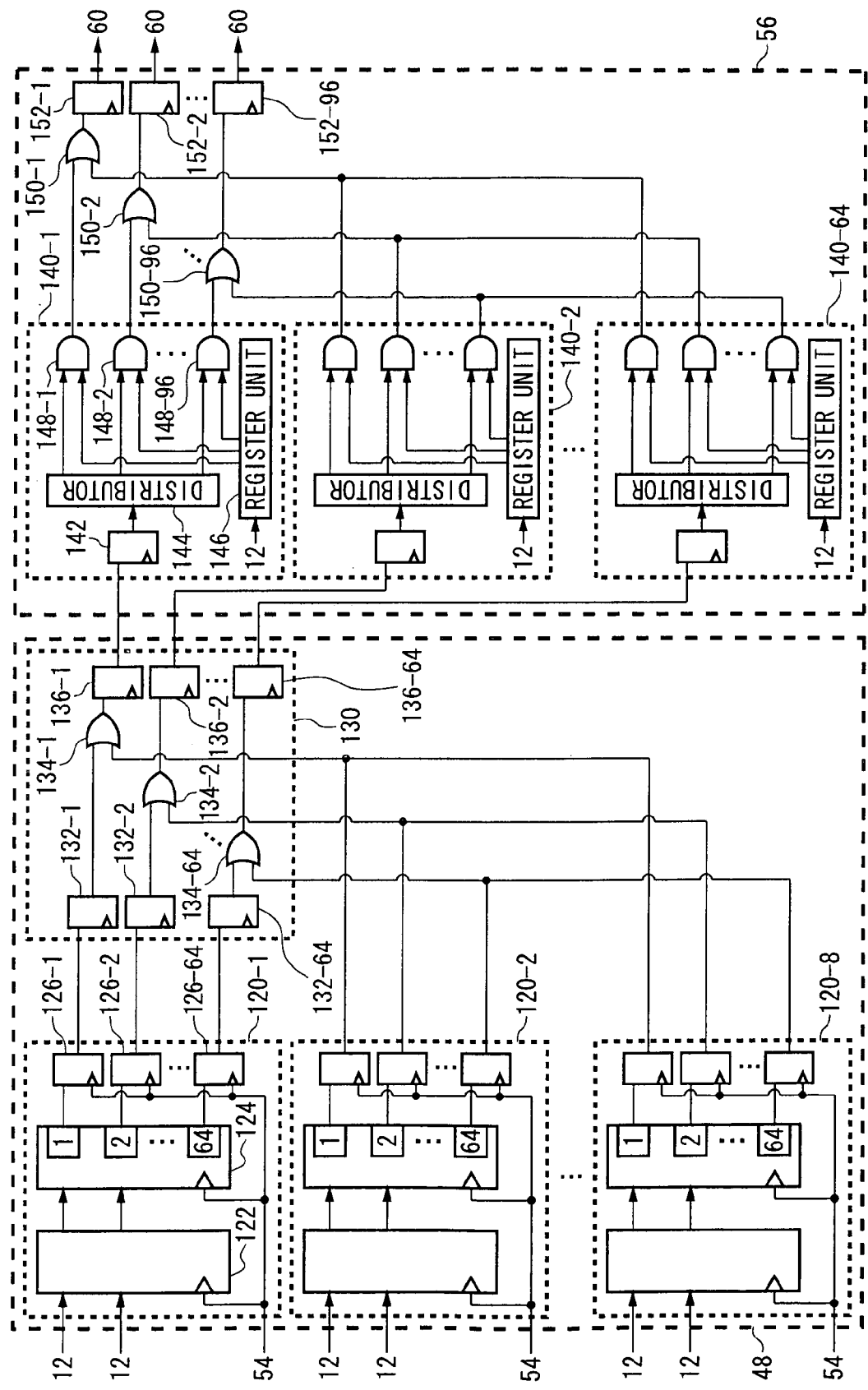
FIG. 9 is a drawing exemplary showing a configuration of a generation circuit 48 and a timing signal distributing circuit 56.

FIG. 9 is a drawing exemplary showing a configuration of the generation circuit 48 and the timing signal distributing circuit 56. The generation circuit 48 includes a plurality of buses (120-1 to 120-8, hereinafter referred to as 120) and an operating circuit 130.

The plurality of buses 120 is provided corresponding to a plurality of host computers of the control unit 12, and is controlled by each corresponding host computer. The bus 120 has a flip-flop 122, a distributing circuit 124, and a plurality of flip-flops (126-1 to 126-64, hereinafter referred to as 126).

The distributing circuit 124 has 64 output ports, outputting the rate signals that are supplied from the control unit 12 via the flip-flop 122 to one or more output port(s) among 64 output ports in accordance with the reference clock supplied from the phase adjustment circuit 50. In addition, the control signal for controlling from which output port the rate signal is to be output is supplied from the control unit 12 via the flip-flop 122 to the distributing circuit 124. For example, the rate signal is a signal indicating the logic H. The plurality of timing signals having different phases can be generated and output by sequentially changing the output ports through which the distributing circuit 124 outputs the rate signals in accordance with the reference clock. For example, by sequentially changing the output port through which the distributing circuit 124 outputs the rate signal from 1 to 64 according to the reference clock, 64 kinds of timing signals, of which the phase resolution is equal to the period of the reference clock while the phases are different with one another. In addition, it is possible to generate any period of timing signal by selecting each output port with a desired period. For example, a plurality of timing signals, of which the periods are different with one another, may be generated for each of the plurality of buses 120 by changing the period for selecting an output port for each of the plurality of buses 120. The period to select the output port can be easily changed by changing the period of the control signal given from the control unit 12.

The operating circuit 130 includes a plurality of flip-flops (132-1 to 132-64, hereinafter referred to as 132), a plurality of OR circuits (134-1 to 134-64, hereinafter referred to as 134), and a plurality of flip-flops (136-1 to 136-64, hereinafter referred to as 136).

The plurality of flip-flops 132, the plurality of OR circuits 134, and the plurality of flip-flops 136 are provided corresponding to the output ports of the distributing circuit 124, and receive the timing signals output from the corresponding output ports. The OR circuits 134 receive the timing signals output from the corresponding output ports of the distributing circuit 124 of each of the plurality of buses 120, outputting a logical sum of each of the received timing signals. The control unit 12 exclusively controls each of the distributing circuits 124 so that the plurality of distributing circuits 124 does not output the timing signal from the same output port simultaneously. For example, the plurality of host computers is previously assigned which output port among the output ports 1–64 of the distributing circuit 124 is to be controlled. Each host computer selects the output port that outputs the timing signal among the assigned output ports in the distributing circuit 124 of the corresponding bus 120. In addition, the plurality of flip-flops 136 synchronizes the timing signals with one another to supply them to the timing signal distributing circuit 56.

The timing signal distributing circuit 56 includes a plurality of distributing units (140-1 to 140-64, hereinafter referred to as 140), a plurality of OR circuits (150-1 to 150-96, hereinafter referred to as 150), and a plurality of flip-flops (152-1 to 152-96, hereinafter referred to as 152).

The plurality of distributing unit 140 is provided corresponding to the plurality of output ports of the distributing circuit 124, and receives the timing signals output from the corresponding output ports. Each distributing unit 140 includes a flip-flop 142, a distributor 144, a register unit 146, and a plurality of AND circuits (148-1 to 148-96, hereinafter referred to as 148).

The distributor 144 receives the timing signal via the flip-flop 142, distributing the timing signal to each of the plurality of AND circuits 148. The plurality of AND circuits 148 is provided corresponding to the plurality of timing sources 60, outputting a logical product of the received timing signal and a signal given from the register unit 146.

The register unit 146 stores command data to indicate which timing source 60 is supplied with the timing signal. In this example, the register unit 146 stores a plurality of bits of command data in which each bit is corresponding to either of the plurality of timing sources 60. This command data is given from the control unit 12 to the register unit 146. The control unit 12 stores the command data that the bit corresponding to the timing source 60 that should supply the timing signal is set to the logic H in the register unit 146.

In addition, the plurality of OR circuits 150 is provided corresponding to the plurality of AND circuits 148, outputting a logical sum of the timing signals output from the corresponding AND circuits 148 in the plurality of distributing units 140. The control unit 12 stores the command data in each register unit 146 so that the AND circuits 148 corresponding to the same timing sources 60 do not output the timing signals simultaneously in each of the distributing units 140. In other words, in the command data stored on each of the registers unit 146, each of the registers unit 146 is supplied with the command data so that the same bits do not show the logic H simultaneously.

The plurality of flip-flops 152 is provided corresponding to the plurality of OR circuits 150, synchronizing the timing signals output from the plurality of OR circuits 150 with each other in order to supply them to the corresponding timing sources 60.

As described above, according to the generation circuit 48 in this example, it is possible to generate the plurality of timing signals having resolution identical with the period of the reference clock and capable of optionally setting the phase and frequency. In addition, according to the timing signal distributing circuit 56, it is possible to optionally select and generate either of the plurality of timing signals generated by the generation circuit 48 to each of the timing sources 60.

Figure 10:
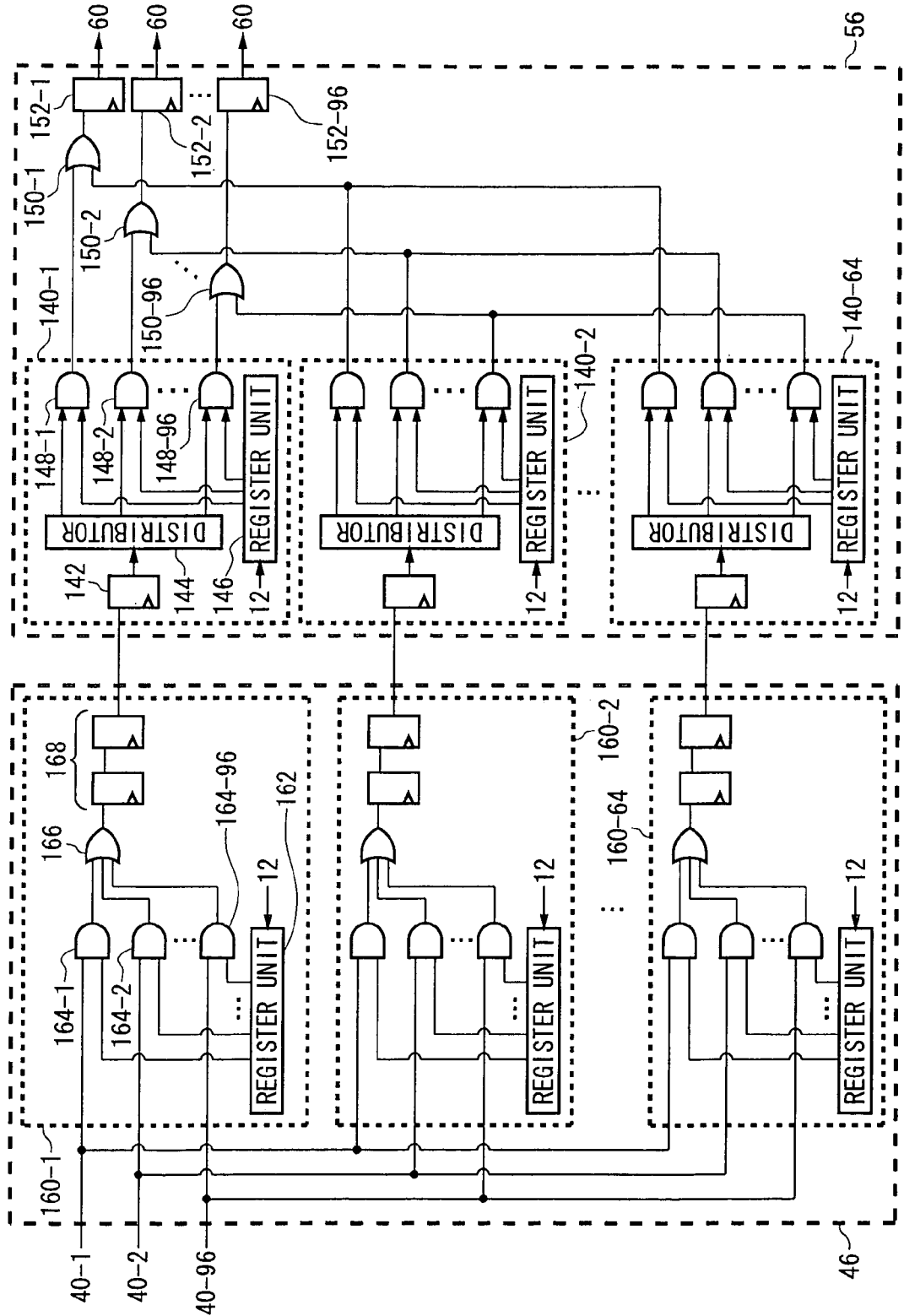
FIG. 10 is a drawing exemplary showing a configuration of a summarizing circuit 46 and the timing signal distributing circuit 56.

FIG. 10 is a drawing exemplary showing a configuration of the summarizing circuit 46 and the timing signal distributing circuit 56. In this example, the timing signal distributing circuit 56 has the same configuration as that of the timing signal distributing circuit 56 explained in FIG. 9.

The summarizing circuit 46 includes a plurality of summarizing unit (160-1 to 160-64, hereinafter referred to as 160). The plurality of summarizing unit 160 is provided corresponding to the plurality of distributing unit 140. Each of the summarizing units 160 includes a register 162, a plurality of AND circuits (164-1 to 164-96, hereinafter referred to as 164), an OR circuit 166, and a shift register unit 168, receiving the fail timing signals output from the plurality of return circuits 40 and outputting a logical sum of two or more fail timing signals among the plurality of fail timing signals. In addition, the plurality of distributing units 140 is provided corresponding to the plurality of summarizing units 160, distributing a result of an operation of the plurality of summarizing units 160 to the plurality of test modules 14.

The plurality of AND circuits 164 is provided corresponding to the plurality of return circuits 40, receiving the fail timing signals or the like output from the corresponding return circuits 40. The plurality of AND circuits 164 outputs a logical product of the received fail timing signals and the signals given from the register162. The OR circuit 166 outputs a logical sum of the fail timing signals output from the plurality of AND circuits 164.

The register 162 stores command data to indicate that the logical sum of either of the plurality of fail timing signals is output to the OR circuit 166. In this example, the register 162 stores a plurality of bits of command data in which each bit is corresponding to either of the plurality of return circuits 40. This command data is supplied from the control unit 12 to the register 162. The control unit 12 stores the command data, in which the bit corresponding to the fail timing signal that is to be supplied to the OR circuit 166 is set to the logic H, on the register 162.

In this example, the control unit 12 stores the command data, which is the same as the command data stored on the register unit 146 of each of the distributing units 140, on the register 162 of the summarizing unit 160 corresponding to each of the distributing units 140. That is, when either of the plurality of test modules 14 that are grouped by the command data stored on the register unit 146 has generated the fail timing signal, the control unit 12 supplies the timing signal based on that fail timing signal to all of the plurality of test modules 14.

In addition, the corresponding distributing unit 140 and summarizing unit 160 may have a common register. For example, the summarizing unit 160 may receive the command data from the register unit 146 of the corresponding distributing unit 140. In this way, it is possible to reduce the number of the register elements of the test apparatus 100.

Figure 11A:
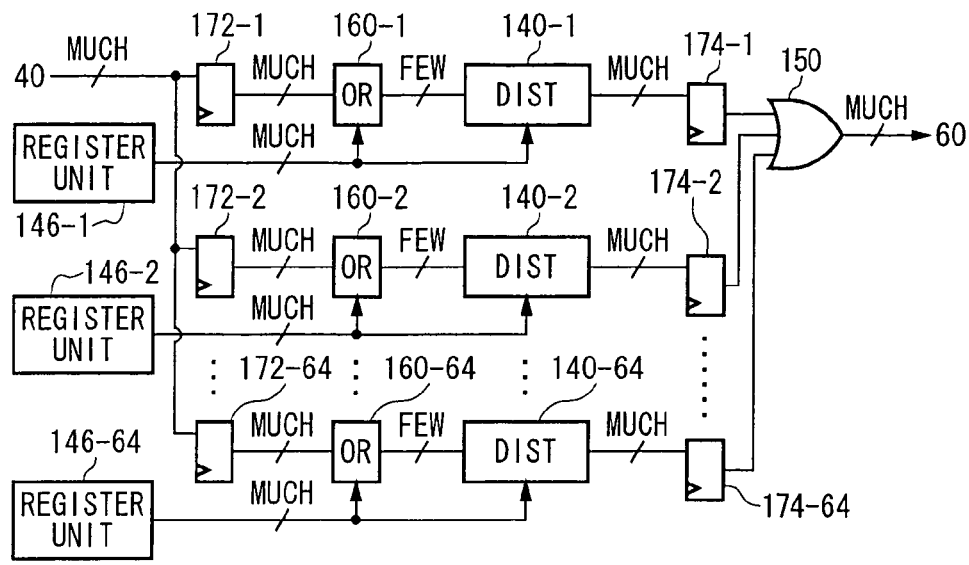
FIGS. 11A to 11C are drawings exemplary showing an arrangement of a plurality of summarizing units 160 and a plurality of distributing units 140 on a semiconductor substrate, respectively.
Figure 11B:
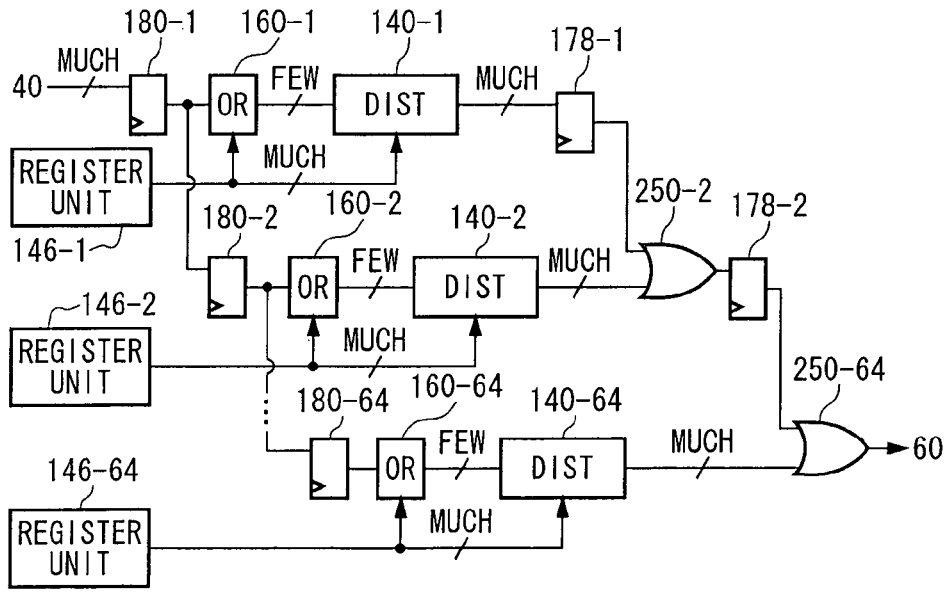
Figure 11C:
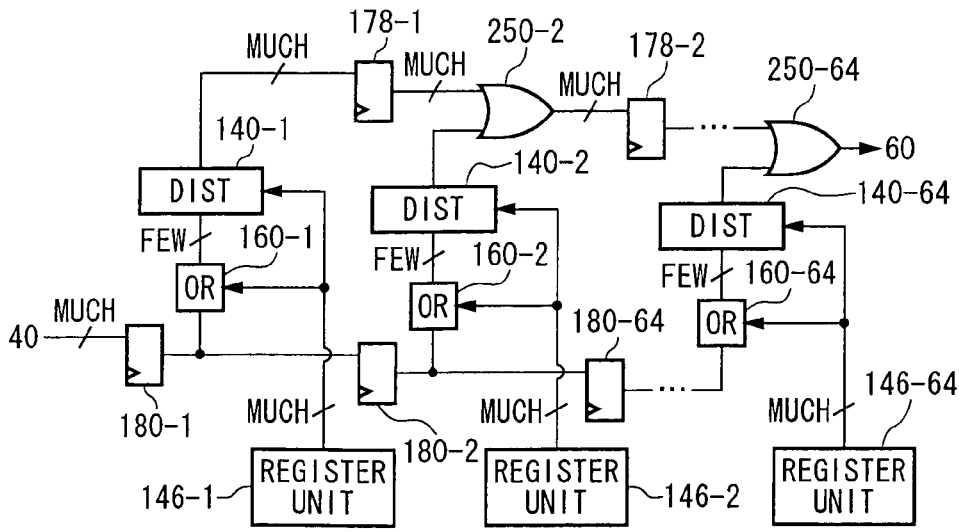

FIGS. 11A to 11C are drawings exemplary showing arrangement of the plurality of summarizing units 160 and the plurality of distributing units 140 on the semiconductor substrate (not shown) respectively.

As shown in FIG. 11A, a plurality of combination of the summarizing units 160 and the distributing units 140 are provided on the semiconductor substrate in parallel. In addition, the summarizing circuit 46 further includes a plurality of flip-flops (172-1 to 172-64, hereinafter referred to as 172) that are provided corresponding to the plurality of summarizing units 160. The plurality of flip-flops 172 supplies the plurality of fail timing signals received from the return circuit 40 to the plurality of summarizing circuits 46, the signals being synchronized with one another.

In addition, the timing signal distributing circuit 56 further includes a plurality of flip-flops (174-1 to 174-64, hereinafter referred to as 174) that are provided corresponding to the plurality of distributing units 140. The plurality of flip-flops 174 supply the plurality of fail timing signals received from the corresponding distributing units 140 to the OR circuit 150 in synchronization with each other. By such a configuration, it is possible to synchronize each of the summarizing units 160 and the distributing units 140 with one another and to process in a pipelining method.

In addition, as shown in FIG. 11B, the summarizing circuit 46 may have a plurality of flip-flops (180-1 to 180-64, hereinafter referred to as 180) that is provided corresponding to the plurality of summarizing units 160. The plurality of flip-flops 180 is cascaded, sequentially supplying the fail timing signals to the corresponding summarizing circuits 46. In other words, the fail timing signals are supplied to each of the summarizing circuits 46 by different timings.

In addition, as shown in FIG. 11B, in place of the OR circuit 150, there may be provided a plurality of OR circuits (250-2 to 250-64, hereinafter referred to as 250). The plurality of OR circuits 250 is provided corresponding to the plurality of distributing units (140-2 to 140-64). Each of the OR circuits 250 is cascaded, and the OR circuit 250-2 outputs a logical sum of the fail timing signals output from the distributing unit 140-1 and the distributing unit 140-2. In addition, another OR circuit 250 outputs a logical sum of the logical sum output from the OR circuit 250 of the preceding stage and the fail timing signal output from the corresponding distributing unit 140. By such a configuration, it is possible to reduce a delay of operations of the plurality of summarizing circuits 46 and the plurality of timing signal distributing circuits 56.

In addition, the summarizing unit 160 and the corresponding distributing unit 140 are connected in series in the first direction on the semiconductor substrate. In FIG. 10, the register 162 and the register unit 146 are respectively provided in the summarizing unit 160 and the distributing unit 140. However, in this example, the common register unit 146 is provided in the outside.

The plurality of register units 146 is provided corresponding to the plurality of summarizing units 160 and the plurality of distributing units 140. The plurality of register units 146 supply control signals having a plurality of bits to the corresponding summarizing units 160 and the distributing units 140. Here, the control signals having a plurality of bits control whether to perform a logical operation using either of the plurality of fail timing signals in the summarizing units 160 and whether to distribute the result of the logical operation to either of the plurality of rest modules 14 in the distributing units 140. As shown in FIG. 11B, it is preferable that each of the register units 146, and the corresponding summarizing units 160 and the distributing units 140 are connected in the first direction.

In addition, as shown in FIG. 11C, it is preferable that at least a part of a wiring for connecting the summarizing unit 160 with the test module 14, that is, a wiring for connecting the summarizing unit 160 with the return circuit 40, is provided on the semiconductor substrate along the second direction perpendicular to the first direction. In addition, it is preferable that at least a part of a wiring for connecting the distributing unit 140 with the test module 14, i.e., a wiring for connecting the distributing unit 140 with the timing source 60, is provided on the semiconductor substrate along the second direction perpendicular to the first direction.

By such a configuration, it is possible to prevent the wiring having a lot of signal lines from slanting on the semiconductor substrate in a transverse direction or in a longitudinal direction. On the semiconductor substrate, the number of signal lines having the same direction is limited to a fixed number. However, according to the configuration of this example, it is possible to efficiently distribute the signal lines in a transverse direction and in a longitudinal direction.

Figure 12:
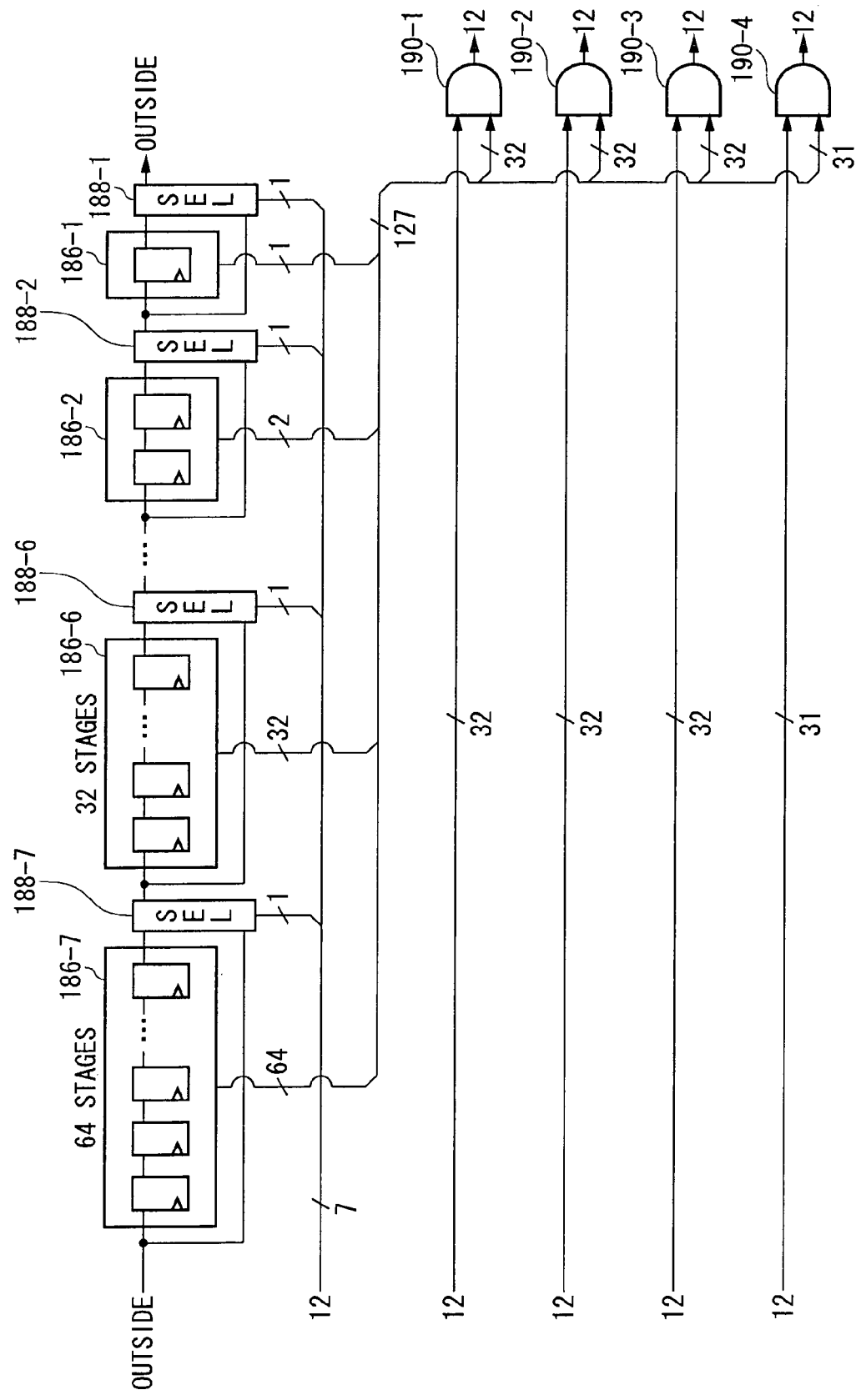
FIG. 12 is a drawing exemplary showing a configuration of a plurality of flip-flop units 186 and a plurality of selection units 188.

FIG. 12 shows an example of a configuration of a plurality of flip-flop units (186-1 to 186-7, hereinafter referred to as 186) and a plurality of selection units (188-1 to 188-7, hereinafter referred to as 188). Each of the plurality of flip-flops (42, 52, 62) described with reference to FIG. 3 may have the same configuration as that of the plurality of flip-flop units 186 to be described with reference to FIG. 12, and each of the clock selection unit 54, the return signal selection unit 44. Moreover, the timing signal selection unit 64 described with reference to FIG. 3 may have the same configuration as that of the plurality of selection units 188 to be described with reference to FIG. 12.

The plurality of flip-flop units 186 is cascaded, and each of the flip-flop units 186 has the cascaded flip-flops. The flip-flop unit 186 receives the input reference clock, the timing signal, the fail timing signal, etc., and the cascaded flip-flops sequentially transfer the received signal to the flip-flops of the next stages in accordance with the reference clock.

In addition, it is preferable that the number of the cascaded flip-flops in each of flip-flop units 186 is different from the other. For example, each of the flip-flop units 186-m has the flip-flops cascaded by 2m-1 stages. The plurality of selection units 188 is provided corresponding to the plurality of flip-flop units 186, selecting either of a signal that is input into the corresponding flip-flop unit 186 or a signal that the corresponding flip-flop unit 186 outputs in order to supply the flip-flop unit 186 of the next stage. It is controlled by the control unit 12 which signal each selection unit 188 selects. By such a configuration, it is possible to easily control the reference clock, the timing signal, the fail timing signal, etc., so as to pass through the desired number of flip-flops.

In addition, it is preferable that the return circuit 40, the phase adjustment circuit 50, and the timing source 60 further include means for reading the value stored on each of the plurality of flip-flops (42, 52, 62). For example, as shown in FIG. 12, they may further include a plurality of AND circuits 190. The plurality of AND circuits 190 receives the value stored on each flip-flop, supplying the value stored on each flip-flop to the control unit 12 in accordance with the control signal given from the control unit 12.

Figure 13:
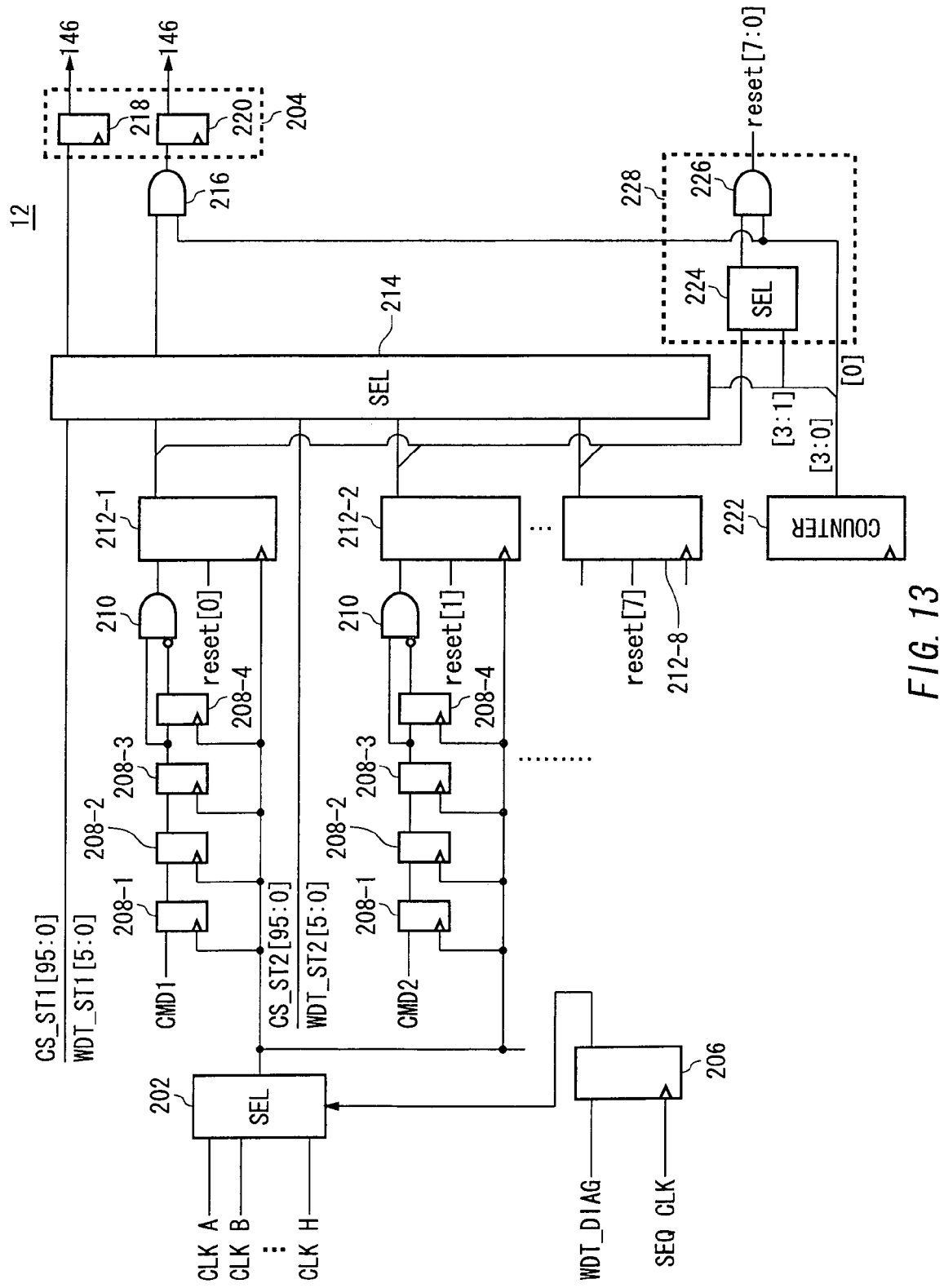
FIG. 13 is a drawing exemplary showing a configuration of a writing control circuit that controls a plurality of register units 146 and is provided in a control unit 12.

FIG. 13 shows an example of a configuration of a writing control circuit that controls the plurality of register units 146 and is provided in the control unit 12. The writing control circuit includes a plurality of request signal storing units (212-1 to 212-8, hereinafter referred to as 212), a selector 202, a flip-flop 206, a plurality of flip-flops (208-1 to 208-4, hereinafter referred to as 208), a plurality of AND circuits 210, a counter 222, a reset unit 228, an AND circuit 216, and a writing unit 204.

The selector 202 is provided to be able to receive internal clocks (CLKA to CLK H) of the plurality of host computers provided in the control unit 12, selecting and outputting either of the internal clocks. A selection control signal is supplied from the flip-flop 206 to the selector 202, selecting either of the clocks in accordance with the selection control signal.

The flip-flop 206 receives the selection control signal, supplying the selection control signal to the selector 202 in accordance with the clock being input. The selection control signal is a signal that selects either of the internal clocks being supplied from the host computer to selector 202.

The plurality of request signal storing unit 212 is provided corresponding to the plurality of host computers, storing the writing request signals from the corresponding host computers. In this example, the writing request signal is a signal of the logic H to indicate to change command data of either of the register units 146. Each of the request signal storing units 212 receives the writing request signal through the plurality of flip-flops 208 and the AND circuit 210. The plurality of flip-flops (208-1 to 208-3) removes so-called meta-stable of the writing request signal.

In addition, the flip-flop 208-4 and the AND circuit 210 are provided to supply the writing control signal to the corresponding request signal storing units 212 during small time from a rising edge of the given writing control signal.

The host selection unit 214 sequentially selects the plurality of request signal storing units 212, receiving and outputting the stored data stored on the selected request signal storing unit 212. The counter 222 sequentially generates a plurality of host specification signals to indicate the plurality of request signal storing units 212 in order to supply them to the host selection unit 214, and the host selection unit 214 sequentially selects the request signal storing units 212 specified by the host specification signals received sequentially. The counter 222 sequentially generates binary numbers, for example, from zero to number of two times of number of the plurality of request signal storing units 212, outputting the data, in which the least significant bit from the generated binary number is removed, as the host specification signal. In this example, the writing control circuit has eight request signal storing units 212, the counter 222 sequentially generates a binary number of 0000 to 1111 in an ascending order.

In addition, the host selection unit 214 receives command data (CS_ST1 to CS_ST8) that is to be written in response to the writing request signal and register unit specification data (WDT_ST1 to WDT_ST8) for specifying the register units 146 that is to write the command data from each of the host computers, supplying the command data and the register unit specification data received from the host computer corresponding to the selected request signal storing unit 212.

The writing unit 204 receives the storing data output from the that host selection unit 214, the command data that is to be written in the register unit 146, and the register unit specification data to specify the register unit 146 that is to write the command data, writing the command data in the register unit 146 specified by the register unit specification data when the received storing data is the writing request signal. The writing unit 204 has the flip-flop 218 and the flip-flop 220. The flip-flop 218 supplies the command data to the register unit 146 specified by the register unit specification data, and the flip-flop 220 outputs a write enable signal to admit a writing to the register unit 146.

The reset unit 228 resets the writing request signal stored on the request signal storing unit 212 selected by the host selection unit 214 when the storing data received by the host selection unit 214 is the writing request signal. For example, the reset unit 228 receives the plurality of storing data stored on the plurality of request signal storing units 212 and the host specification signal generated by the counter unit, resetting the writing request signal stored on the request signal storing unit 212 specified by the host specification signal when the storing data stored on the request signal storing unit 212 according to the host specification signal is the writing request signal.

The reset unit 228 has the selector 224 and the AND circuit 226. The selector 224 receives an eight-bit signal of which each bit is the storing data stored on the plurality of request signal storing units 212, when a bit specified by the host specification signal in the received signal is a logic H, supplying the reset signal in which only that bit is processed as the logic H to the AND circuit 226. The AND circuit 226 receives the least significant bit of the binary number generated from the counter 222, when the least significant bit of the binary number generated from the counter 222 is the logic H, supplying the reset signal to the request signal storing unit 212 and resetting the request signal storing unit 212 according to a bit position of the reset signal to indicate the logic H.

In addition, the AND circuit 216 supplies the storing data output from the host selection unit 214 to the flip-flop 220 of the writing unit 204 when the least significant bit of the binary number generated from the counter 222 shows the logic H.

According to the writing control circuit in this example, it is possible to efficiently change the command data in each of the register units 146. In addition, since the command data in the register units 146 can be also changed by any of the plurality of host computers, it is possible to share the register units 146 using the plurality of host computers. For example, each register unit 146 can be assigned based on which host computer is used for every testing. Therefore, it is possible to reduce the number of the register elements of the test apparatus 100.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

INDUSTRIAL APPLICABILITY

According to the present invention, it is possible to easily perform the adjustment of the phase of the timing signal given to the test modules according to characteristics of the plurality of test modules.

What is claimed is:

1. A test apparatus for testing a plurality of electronic devices, comprising:
 a plurality of test modules each operable to supply individual, unique test patterns to the respective electronic device;
 a reference clock generation unit operable to generate a reference clock;
 a generation circuit operable to generate timing signals that cause said plurality of test modules to operate based on the reference clock;
 a plurality of timing sources being provided in response to said plurality of test modules and operable to supply the timing signals to the corresponding test modules; and
 a control unit operable to:
  control phases of each of the timing signals supplied to the respective test module by the corresponding timing source so that timings at which each of said test modules outputs the respective test patterns according to the different timing signals are made to be equal; and
  supply said test patterns to said plurality of test modules.

2. A test apparatus as claimed in claim 1, wherein each of said timing sources comprises:
 a plurality of cascaded flip-flops that receive the timing signals and sequentially transfer the timing signals according to the reference clock; and
 a timing signal selection unit that receives the timing signals output from each of said flip-flops, selects one of the received plurality of timing signals, and supplies the selected signal to said test module in order to adjust the phases of the timing signals supplied to said test modules,
 said control unit controls which timing signal among the plurality of timing signals is to be selected by said timing signal selection unit.

3. A test apparatus as claimed in claim 2, further comprising a variable delay circuit for the reference clock being provided between said reference clock generation unit and said plurality of flip-flops for delaying the reference clock to supply the delayed clock to said plurality of flip-flops, wherein
 said control unit sequentially changes a delay amount of said variable delay circuit for the reference clock, detects the delay amount of said variable delay circuit for the reference clock by which the timing at which the value of the timing signal is changed is substantially equal to the timing at which one of the plurality of flip-flops receives the value of the timing signal, and sets the delay amount of said variable delay circuit for the reference clock to a delay amount deviated from the detected delay amount by substantially half a period of the reference clock.

4. A test apparatus as claimed in claim 1, further comprising a plurality of return circuits operable to receive fail timing signals to indicate the timing at which the fail occurs in the output patterns output from the electric device from said plurality of corresponding test modules and output the fail timing signals to the timing sources, wherein said return circuits are provided in response to said plurality of test modules, wherein said control unit controls said plurality of return circuits so that the timings at which each of said return circuits outputs the fail timing signals are substantially equal.

5. A test apparatus as claimed in claim 4, wherein each of said return circuits comprises:

a plurality of cascaded flip-flops that receive the fail timing signals and sequentially transfer the fail timing signals according to the reference clock; and a return signal selection unit that receives the fail timing signals output from each of said flip-flops, selects one of the received plurality of fail timing signals, and supplies the selected signal to said timing source in order to adjust the timing at which the fail timing signal is supplied to said timing source, and said control unit controls which fail timing signal among the plurality of timing signals is to be selected by said return signal selection unit.

6. A test apparatus as claimed in claim 5, further comprising a variable delay circuit for the return circuit being provided between said test modules and said plurality of flip-flops for delaying the fail timing signal to supply the delayed signal to said plurality of flip-flops, wherein said control unit sequentially changes a delay amount of said variable delay circuit for the return circuit, detects the delay amount of said variable delay circuit for the return circuit by which the timing at which the value of the fail timing signal is changed is substantially equal to the timing at which one of the plurality of flip-flops receives the value of the fail timing signal, and sets the delay amount of said variable delay circuit for the return circuit to a delay amount deviated from the detected delay amount by substantially half a period of the reference clock.

7. A test apparatus as claimed in claim 6, wherein each of the plurality of return circuits supplies the fail timing signal to each of said test modules via said timing sources.

8. A test apparatus as claimed in claim 7, further comprising a summarizing circuit operable to receive the fail timing signals output from said return circuits and perform logic operations based on the plurality of fail timing signals, wherein said plurality of timing sources supply the results of logic operations by said summarizing circuit to said corresponding test modules.

* * * * *